(12) United States Patent
Markham et al.

(10) Patent No.: US 9,227,295 B2
(45) Date of Patent: Jan. 5, 2016

(54) NON-POLISHED GLASS WAFER, THINNING SYSTEM AND METHOD FOR USING THE NON-POLISHED GLASS WAFER TO THIN A SEMICONDUCTOR WAFER

(75) Inventors: Shawn Rachelle Markham, Harrodsburg, KY (US); Windsor Pipes Thomas, III, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 378 days.

(21) Appl. No.: 13/474,137

(22) Filed: May 17, 2012

(65) Prior Publication Data

US 2012/0302063 A1    Nov. 29, 2012

Related U.S. Application Data

(60) Provisional application No. 61/490,818, filed on May 27, 2011.

(51) Int. Cl.
| | |
|---|---|
| *B44C 1/22* | (2006.01) |
| *B24B 37/04* | (2012.01) |
| *B24B 1/00* | (2006.01) |
| *B24B 7/22* | (2006.01) |

(Continued)

(52) U.S. Cl.
CPC .......... *B24B 37/042* (2013.01); *B24B 1/00* (2013.01); *B24B 7/228* (2013.01); *C03B 17/064* (2013.01); *H01L 21/304* (2013.01); *H01L 21/30604* (2013.01); *H01L 21/30625* (2013.01); *H01L 21/6835* (2013.01); *H01L 21/6836* (2013.01); *H01L 2221/6834* (2013.01); *H01L 2221/68327* (2013.01); *H01L 2221/68381* (2013.01); *Y10T 428/21* (2015.01); *Y10T 428/24628* (2015.01)

(58) Field of Classification Search
CPC ...... B24B 7/228; H01L 21/302; H01L 21/304
USPC ............... 428/1.32, 1.62, 846.9, 630; 216/31
See application file for complete search history.

(56) References Cited

U.S. PATENT DOCUMENTS

| | | |
|---|---|---|
| 7,183,178 B2 | 2/2007 | Arai |
| 7,331,780 B2 | 2/2008 | Adachi |

(Continued)

FOREIGN PATENT DOCUMENTS

| | | | |
|---|---|---|---|
| EP | 2253598 A1 | 11/2010 | |
| EP | 2455346 | 5/2012 | .............. C03B 17/06 |

(Continued)

OTHER PUBLICATIONS

Venn Diagrams, via http://www.vosesoftware.com/ModelRiskHelp/index.htm#Probability_theory_and_statistics/The_basics/Probability_rules_and_diagrams/Venn_diagrams.htm ; pp. 1-3; No date available.*

(Continued)

*Primary Examiner* — Binh X Tran
(74) *Attorney, Agent, or Firm* — John T. Haran

(57) ABSTRACT

A non-polished glass wafer, a thinning system, and a method for using the non-polished glass wafer to thin a semiconductor wafer are described herein. In one embodiment, the glass wafer has a body (e.g., circular body) including a non-polished first surface and a non-polished second surface substantially parallel to each other. In addition, the circular body has a wafer quality index which is equal to a total thickness variation in micrometers plus one-tenth of a warp in micrometers that is less than 6.0.

19 Claims, 13 Drawing Sheets

(51) Int. Cl.
  *H01L 21/304* (2006.01)
  *H01L 21/306* (2006.01)
  *C03B 17/06* (2006.01)
  *H01L 21/683* (2006.01)

(56) References Cited

U.S. PATENT DOCUMENTS

| | | |
|---|---|---|
| 7,462,551 B2 | 12/2008 | Kulkarni |
| 7,833,895 B2 | 11/2010 | Bonifield |
| 7,842,548 B2 | 11/2010 | Lee |
| 8,232,140 B2 | 7/2012 | Yang et al. .................. 438/109 |
| 2004/0063009 A1 | 4/2004 | Phan et al. .................. 430/30 |
| 2004/0154336 A1 | 8/2004 | Pitbladdo ..................... 65/53 |
| 2004/0232488 A1 | 11/2004 | Forbes ......................... 257/347 |
| 2005/0268657 A1 | 12/2005 | Adamowicz et al. ......... 65/53 |
| 2007/0126103 A1 | 6/2007 | Shi |
| 2008/0311725 A1 | 12/2008 | Di Cioccio et al. .......... 438/455 |
| 2009/0017248 A1 | 1/2009 | Larson et al. ................. 428/41.5 |
| 2009/0217516 A1 | 9/2009 | Pawlowski et al. ........... 29/832 |
| 2009/0263214 A1 | 10/2009 | Lee |
| 2009/0321747 A1 | 12/2009 | Murphy et al. ................ 257/77 |
| 2010/0062611 A1 | 3/2010 | Liu et al. ........................ 438/747 |
| 2010/0096720 A1* | 4/2010 | Ohnuma et al. ............... 257/506 |
| 2010/0112782 A1 | 5/2010 | Teixeira |
| 2010/0212360 A1 | 8/2010 | Delia |
| 2010/0263794 A1 | 10/2010 | George et al. ................ 156/344 |
| 2010/0273289 A1 | 10/2010 | Hung |
| 2011/0025344 A1 | 2/2011 | Kumagai |
| 2011/0233562 A1* | 9/2011 | Harada et al. ................. 257/77 |
| 2011/0289969 A1 | 12/2011 | Delia |
| 2012/0013013 A1* | 1/2012 | Sadaka et al. ................. 257/773 |
| 2012/0091585 A1 | 4/2012 | Buchwalter et al. .......... 257/738 |
| 2012/0098136 A1* | 4/2012 | Lindgren et al. .............. 257/770 |
| 2012/0100464 A1* | 4/2012 | Kageyama ..................... 430/5 |
| 2012/0228612 A1* | 9/2012 | Seki et al. ...................... 257/52 |
| 2012/0261787 A1* | 10/2012 | Stamper ......................... 257/506 |
| 2012/0319569 A1* | 12/2012 | Okamoto et al. .............. 313/504 |

FOREIGN PATENT DOCUMENTS

| | | | |
|---|---|---|---|
| JP | 2000252342 A | 9/2000 | |
| JP | 2005150434 A | 6/2005 | |
| JP | 2005333100 A | 12/2005 | |
| JP | 03798760 B2 | 7/2006 | |
| WO | WO99/25019 | 5/1999 | ............ H01L 21/301 |
| WO | 03014032 A1 | 2/2003 | |
| WO | 2005081888 A2 | 9/2005 | |
| WO | 2005081888 A3 | 9/2005 | |
| WO | 2009070262 A1 | 6/2009 | |
| WO | WO2011/007617 | 1/2011 | ............ C03B 17/06 |
| WO | WO2012/003161 | 1/2012 | ............ H01L 21/20 |

OTHER PUBLICATIONS

International Search Report Dated Aug. 13, 2012.
European Search Report, European Patent Office, EP12792536, p. 1-7 (Oct. 8, 2014.).

* cited by examiner

NON-POLISHED GLASS WAFER, THINNING SYSTEM AND METHOD FOR USING THE NON-POLISHED GLASS WAFER TO THIN A SEMICONDUCTOR WAFER

CROSS-REFERENCE TO RELATED APPLICATION

This application claims the benefit of U.S. Provisional Application Ser. No. 61/490,818, filed on May 27, 2011, the contents of which are incorporated by reference herein.

TECHNICAL FIELD

The present disclosure relates to a non-polished glass wafer, a thinning system, a method for using the non-polished glass wafer to thin a semiconductor wafer, and a method for manufacturing the non-polished glass wafer.

BACKGROUND

Moore's law is perhaps one of the best known trends among a wide range of technologies relating to semiconductor integrated circuits. Moore's law describes a trend in computing hardware where the number of transistors that can be placed inexpensively on an integrated circuit doubles approximately every two years. This trend has continued for more than half a century and is expected to continue for at least the next few years. Moore's law has served the industry well and has even been incorporated for decades into the International Technology Roadmap for Semiconductors, known throughout the world as ITRS, for guiding long-term planning and setting targets for research and development.

The cost of making smaller semiconductor integrated circuits and smaller dimensions (nodes) on semiconductor integrated circuits has been increasing dramatically the past few years during the transition from i-Line to KrF to ArF and now to the newly emerging extreme ultraviolet (EUV) photolithography technologies. In view of this, a few industry experts have contended that there is not much farther the semiconductor industry can cost effectively reduce the size of the dimensions on semiconductor integrated circuits in the same time frame as stated by Moore's Law.

However, another mechanism that can be used to improve performance relates to the packaging of the integrated circuits. Once a wafer of integrated circuits is completed and diced, the integrated circuit needs to be packaged to be of use. FIG. 1 (PRIOR ART) is a diagram illustrating how the packaging of integrated circuits has evolved over the years from wire bound 102, flip chip 104, stacked die 106, package-on-package 108 to three-dimensional integrated circuit 110 (3D IC 110).

The three-dimensional integrated circuit 110 (3D IC 110) is a semiconductor circuit in which two or more layers of active electronic components are integrated both vertically and horizontally into a single circuit. 3D IC packaging should not be confused with 3D packaging which has been in use for years and saves space by stacking separate chips in a single package. 3D packaging, known as System in Package (SiP), does not integrate the chips into a single circuit. In particular, the chips in the SiP communicate with off-chip controls much as if they were mounted in separate packages on a normal circuit board.

In contrast, the 3D IC 110 acts as a single chip where all the components on the different layers communicate with on-chip controls, whether vertically or horizontally. There are many advantages associated with 3D IC packaging that can help extend the performance of Moore's law and possibly extend the performance even more than predicted by Moore's law. These advantages can include:

1. Size—3D IC 110 has a much smaller footprint when compared to similar integrated circuits (ICs) packaged with a different technology. FIG. 2 (PRIOR ART) illustrates a 32 Gigabyte (GB) standard eight IC design 202 which is four inches long and located on a traditional circuit board and a side view of a commercially-available 32 GB 3D memory stack 204 having eight IC's each being 55 micrometers (μm) thick and 1 millimeter (mm) wide.

2. Speed—with propagation delay varying with the square of the wire length, a much shorter interconnect distance means much faster speeds for the 3D IC 110 when compared to ICs packaged with different technologies.

3. Power—results of 10× improvement in power consumption due to increased efficiency and shorter path lengths have been seen with 3D IC 110 when compared to ICs made by other packaging technologies.

4. Cost—highly complex (expensive) IC's can be broken into several sections meaning that a defect will affect a much smaller portion of the completed 3D IC 110 when compared to ICs of other packaging technologies.

Therefore, the semiconductor industry has undertaken a well documented and aggressive approach to develop and implement this emerging 3D IC packaging technology. To implement this technology and stack IC's in a 3D IC package, the silicon wafer needs to be thinned to much less than the standard silicon wafer thicknesses—from around 700 μm to around 50 μm-60 μm (see FIG. 2). This requirement for thinned silicon is clearly documented in the ITRS roadmap as well. Hence, there is no question that silicon wafers will be required to be thinned to tens of micrometers to utilize 3D IC packaging.

To thin the silicon wafer to this thickness, a support wafer or carrier is temporarily bonded to the silicon wafer to provide mechanical integrity while the excess silicon is removed from the silicon wafer. The support wafer can be made of two different substrates, namely silicon or glass. The glass wafer has emerged as the dominant carrier, due not only to cost reasons but also due to the inflexible coefficient of thermal expansion of the silicon carrier, the inability to inspect the quality of bond between the silicon wafer and the silicon carrier and further due to the severe restrictions on the form factor of the silicon carrier. With respect to the severe restrictions on the form factor of the silicon carrier, the silicon carrier is only available economically in exact diameters as the silicon wafer to be thinned while it is desired to have carriers with a slightly larger diameter than the silicon wafer to be thinned. The reason for the severe restrictions on the form factor of the silicon carrier is that the semiconductor industry is tooled for very precise silicon wafer dimensions to be able to utilize the major semiconductor companies' lithography equipment. Therefore, the supply chain is not configured to supply silicon carriers at reasonable costs that are even one mm larger in diameter than the standard silicon wafer. The carrier should have a larger diameter than the silicon wafer to be thinned because in the thinning (grinding, polishing) process mechanical support should extend beyond the edge of the silicon wafer being thinned. Furthermore, the most widely used thinning systems in development by the major semiconductor companies require a bonding system which utilizes an ultraviolet (UV) light source to adhere the bonding agent located between the carrier and the silicon wafer, and a laser to remove the bonding agent after the thinning process. Since, silicon wafers do not transmit UV light or laser beams this means that glass wafers will be widely used for many thinning systems.

For a glass wafer, there are at least two physical attributes that have historically been difficult and cost prohibitive to achieve simultaneously. These two physical attributes are:

I. Total Thickness Variation (TTV)—the TTV of the silicon wafer to be thinned can only be as good as the TTV of the glass carrier wafer. As the silicon wafer requirements become thinner, the TTV should be less than about 2.0 µm. Referring to FIG. 3 (PRIOR ART), there is a schematic diagram illustrating an exemplary 3D IC structure 300 which has a poor TTV that resulted in poor interconnects 302 between a top IC layer 304 and a bottom IC layer 306. Referring to FIG. 4 (PRIOR ART), there is a schematic diagram of a glass wafer 402 used to explain TTV which is defined to be the difference between a highest thickness (Tmax) elevation 404 and a lowest thickness (Tmin) elevation 406 on the entire surface 408 of the unclamped (free state) glass wafer 402.

II. Warp (flatness)—warp of the glass wafer is important for performance of the thinned silicon wafer. The warp should be less than about 60 µm. Referring to FIG. 5 (PRIOR ART), there is a schematic diagram of a glass wafer 502 used to explain warp which is defined as a sum of the absolute values of the maximum distances 504 and 506 which are respectively measured between a highest point 508 and a least squares focal plane 510 (dashed line) applied to a shape of the glass wafer 502 and a lowest point 512 and the least squares focal plane 510 (dashed line). The highest point 508 and the lowest point 512 are both with respect to the same surface of the glass wafer 502. The least squares focal plane 510 is applied to the shape of the unclamped (free state) glass wafer 502. The least squares focal plane 510 is determined by the following method. A plane is determined by the equation z=A+Bx−Cy. Then, the least squares planar fit is determined through matrix minimization of the sum of the squares of the deviations of the real data from the plane. This method finds the least squares values A, B, and C. The matrices are determined as follows:

$$\begin{bmatrix} n & \sum x_j & \sum y_j \\ \sum x_j & \sum x_j^2 & \sum x_j * y_j \\ \sum y_j & \sum x_j * y_j & \sum y_j^2 \end{bmatrix} * \begin{bmatrix} A \\ B \\ C \end{bmatrix}$$

By solving this equation for A, B, and C, the least squares fit is complete

To date, several different approaches have been made by the semiconductor industry in an attempt to cost effectively form a glass wafer that has both the desired TTV and warp attributes. One approach that has been used to meet the TTV and warp attributes is to polish the glass wafer. However, it is difficult to control both warp and TTV when polishing the glass wafer, as they frequently move counter to each other during the polishing process. Referring to FIG. 6 (PRIOR ART), there is a schematic of an exemplary glass wafer 602 that is polished as shown by line 604 to reduce warp but by reducing warp this will at the same time also increase the TTV. This schematic is not to scale and has been provided so one can readily see how warp and TTV are inter-related.

In addition, the polishing process creates micro-cracks in the surface of the polished glass wafer which leads to a reduced re-cycle rate of the polished glass carrier. Furthermore, the polishing process will not effectively scale to polish glass wafers with a 450 mm outer diameter which will be needed if the silicon wafers to be thinned increase from the largest current 300 mm outer diameter to the future 450 mm outer diameter as predicted by ITRS. This is because the costs for larger glass wafers will scale geometrically with size of the silicon wafer to be thinned because the thickness requirement will be the same but maintaining the same requirements for TTV utilizing the polishing approach will be far more difficult. Plus, fewer glass wafers can be made per polishing run which will also increase the costs as larger glass wafers also means fewer glass wafers can be made per run. Accordingly, there is a need to address these shortcomings and other shortcomings to provide a glass wafer that can be effectively used to thin a silicon wafer.

SUMMARY

A non-polished glass wafer, a thinning system, a method for using the non-polished glass wafer to thin a semiconductor wafer, and a method for manufacturing non-polished glass wafers are described herein. Additional embodiments that include optional features of the non-polished glass wafer, the thinning system, the method for using the non-polished glass wafer to thin a semiconductor wafer, and the method for manufacturing non-polished glass wafers are also described.

In one aspect, there is provided a non-polished glass wafer that comprises a body (e.g., circular, rectangular, square, oval shape) including a non-polished first surface and a non-polished second surface which are substantially parallel to each other. As used herein, the terms "non-polished" or "unpolished" encompass both a) surfaces and articles that have not been polished or smoothened using any mechanical or chemical attrition process and b) surfaces and articles where less than or equal to about 2 micrometers of an outermost portion have been removed by polishing or smoothing using such mechanical or chemical attrition processes. In certain implementations, less than or equal to about 1 micrometer of the outermost portion has been removed. In other situations, for example, where minimal removal of material is desired, less than or equal to about 500 nanometers, or even 100 nanometers, of the outermost portion has been removed. In many implementations, however, none of the outermost portion has been removed. The body has a wafer quality index (WQI), which is equal to a total thickness variation in micrometers plus one-tenth of the warp (also in micrometers), that is less than or equal to 6.0 micrometers. That is, the wafer quality index is equal to TTV (µm) plus [warp (µm)/10]. The total thickness variation is a difference between a highest thickness elevation and a lowest thickness elevation across the body between the non-polished first surface and the non-polished second surface. The warp is a sum of absolute values of a maximum distance between a highest point and a least squares focal plane applied to a shape of the body and a maximum distance between a lowest point and the least squares focal plane, where the highest point and the lowest point are both with respect to same surface of the body.

In another aspect, there is provided a thinning system for thinning a silicon wafer while the silicon wafer is bonded to a non-polished glass wafer. In one embodiment, the thinning system comprises: (a) an enclosure; (b) a support, located within the enclosure, on which is placed the non-polished glass wafer and the silicon wafer which are bonded to one another by a bonding agent, wherein the silicon wafer has a first surface with a circuit die formed therein and a second surface which are substantially parallel to each other, and wherein the non-polished glass wafer has a body (e.g., circular, rectangular, square, oval shape) including a non-polished first surface and a non-polished second surface which are substantially parallel to each other, wherein the body has a wafer quality index which is less than about 6.0, where the wafer quality index is equal to a total thickness variation (μm) plus [warp (μm)/10], where the total thickness variation is a difference between a highest thickness elevation and a lowest thickness elevation across the body between the non-polished first surface and the non-polished second surface, and the warp is a sum of absolute values of a maximum distance between a highest point and a least squares focal plane applied to a shape of the body and a maximum distance between a lowest point and the least squares focal plane, where the highest point and the lowest point are both with respect to same surface of the body; and (c) a thinning mechanism, located within the enclosure, that is suitable for thinning the second surface of the silicon wafer while the silicon wafer is bonded to the non-polished glass wafer.

In yet another aspect, there is provided a method for using a non-polished glass wafer to thin a silicon wafer. The method comprising the steps of: (a) providing the silicon wafer having a first surface with a circuit die formed therein and a second surface which are substantially parallel to each other; (b) providing the non-polished glass wafer comprising a body (e.g., circular, rectangular, square, oval shape) including a non-polished first surface and a non-polished second surface which are substantially parallel to each other, wherein the body has a wafer quality index less than about 6.0, where the wafer quality index is equal to a total thickness variation (μm) plus [warp (μm)/10], where the total thickness variation is a difference between a highest thickness elevation and a lowest thickness elevation across the body between the non-polished first surface and the non-polished second surface, and the warp is a sum of absolute values of a maximum distance between a highest point and a least squares focal plane applied to a shape of the body and a maximum distance between a lowest point and the least squares focal plane, where the highest point and the lowest point are both with respect to same surface of the body, and wherein either the first surface of the silicon wafer or the non-polished first surface of the glass wafer has a bonding agent applied thereto; (c) placing the silicon wafer next to the non-polished glass wafer so the bonding agent bonds the first surface of the silicon wafer to the non-polished first surface of the glass wafer; (d) thinning the second surface of the silicon wafer while the silicon wafer is bonded to the non-polished glass wafer; and (e) separating the thinned silicon wafer from the non-polished glass wafer.

In yet another aspect, there is provided a method for manufacturing non-polished glass wafers. The method comprising the steps of: (a) melting batch materials and forming molten glass; (b) providing a forming device for receiving the molten glass and forming a glass sheet; (c) providing an apparatus comprising an enclosure disposed about the forming body, the enclosure comprising an opening below the forming body to allow a flow of molten glass descending from the forming body to pass from the enclosure, the apparatus further comprising thermal shields positioned below the forming body and spaced apart to form the opening, where the thermal shields are configured for minimizing radiative heat loss from the forming body, each thermal shield being movable relative to the flow of the molten glass, the apparatus further comprises cooling members positioned adjacent to the thermal shields, wherein the step of providing the enclosure further comprises steps of, (i) controlling a pressure within the enclosure; (ii) controlling the cooling members; and (iii) minimizing the opening between the thermal shields to control heat transfer uniformity with respect to the glass sheet; (d) drawing the glass sheet; (e) separating the glass sheet into distinct glass sheets; and (f) cutting at least one of the distinct glass sheets into a plurality of non-polished glass wafers.

Additional aspects will be set forth, in part, in the detailed description, figures and any claims which follow, and in part will be derived from the detailed description, or can be learned by the disclosure. It is to be understood that both the foregoing general description and the following detailed description are exemplary and explanatory only and are not restrictive to scope of disclosure.

BRIEF DESCRIPTION OF THE DRAWINGS

A more complete understanding of the disclosure may be had by reference to the following detailed description when taken in conjunction with the accompanying drawings wherein.

DETAILED DESCRIPTION

Figure 1:
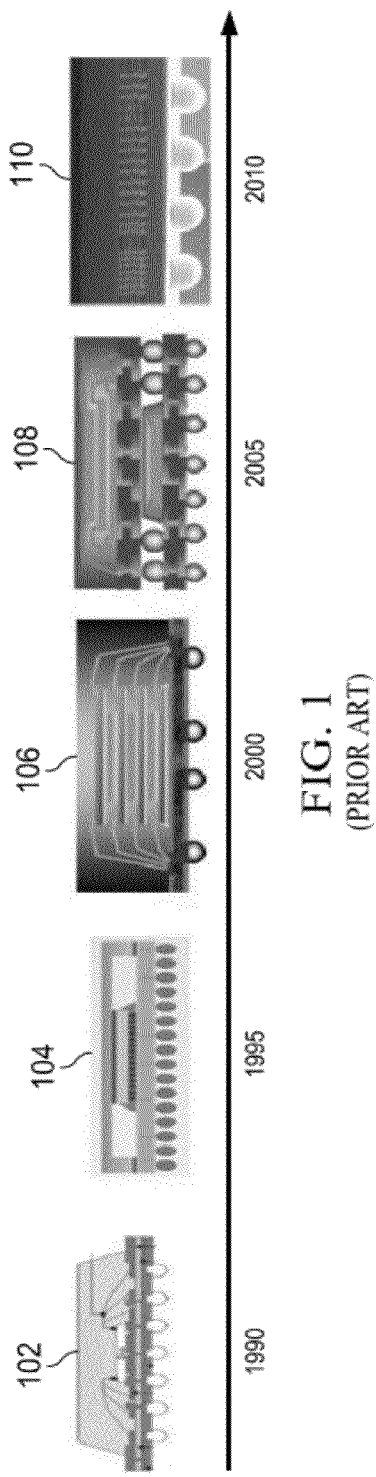
FIG. 1 (PRIOR ART) is a diagram illustrating how the packaging of integrated circuits has evolved over the years from wire bound, flip chip, stacked die, package-on-package to 3D IC.
Figure 2:
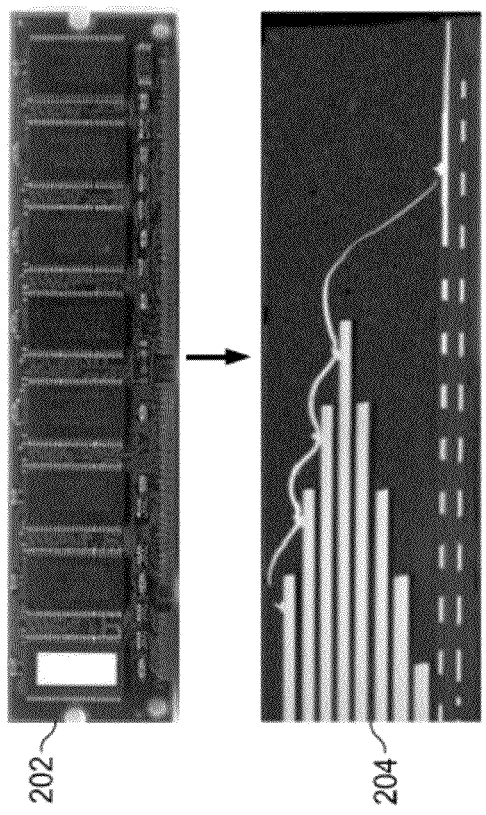
FIG. 2 (PRIOR ART) illustrates a 32 Gigabyte (GB) standard eight IC design (top), which is four inches long, located on a traditional circuit board and a commercially available 32 GB 3D memory stack (bottom) having eight IC's each being 55 μm thick and 1 mm wide.
Figure 3:
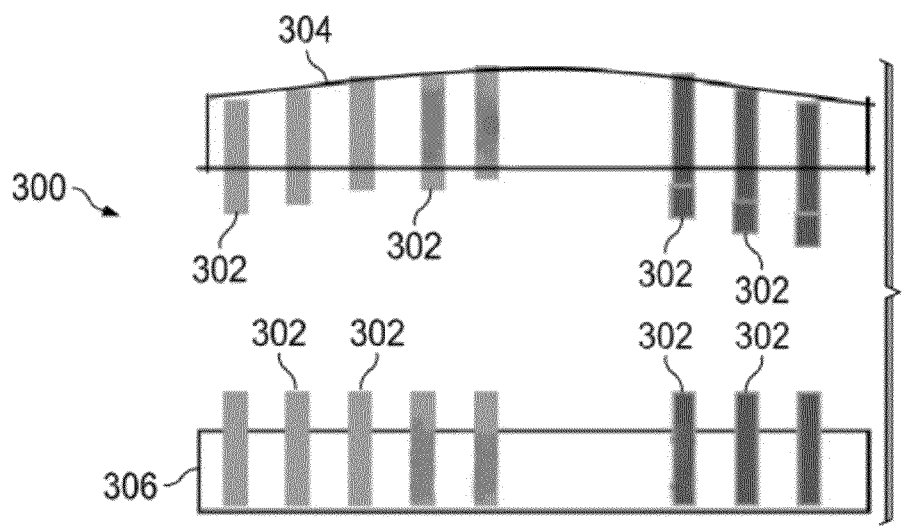
FIG. 3 (PRIOR ART) is a schematic diagram illustrating a 3D IC structure which has a poor TTV that resulted in poor interconnects between a top IC layer and a bottom IC layer.
Figure 4:
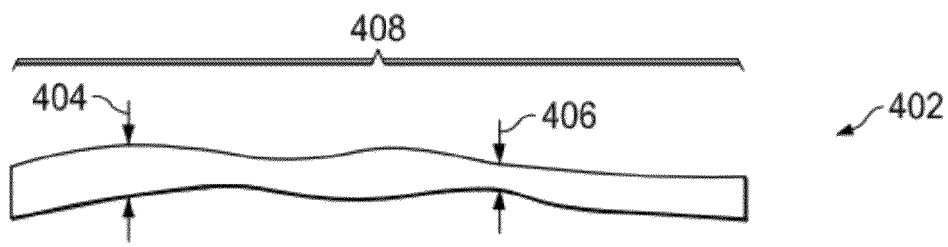
FIG. 4 (PRIOR ART) is a schematic diagram of a glass wafer used to explain TTV which is defined to be the difference between a highest thickness (Tmax) elevation and a lowest thickness (Tmin) elevation on the entire surface of the unclamped (free state) glass wafer.
Figure 5:
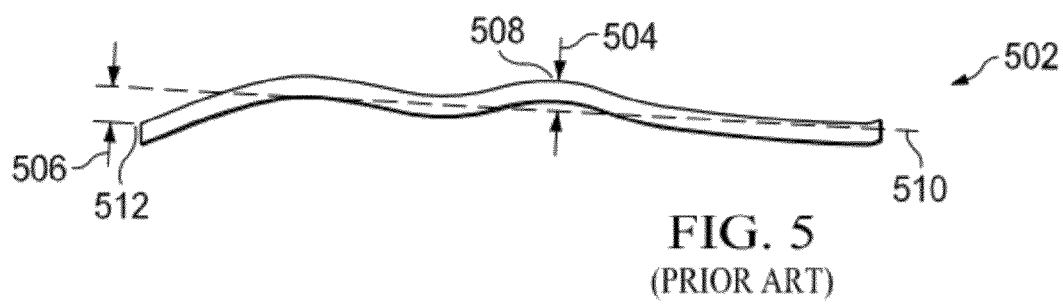
FIG. 5 (PRIOR ART) is a schematic diagram of a glass wafer used to explain the definition of warp.
Figure 6:
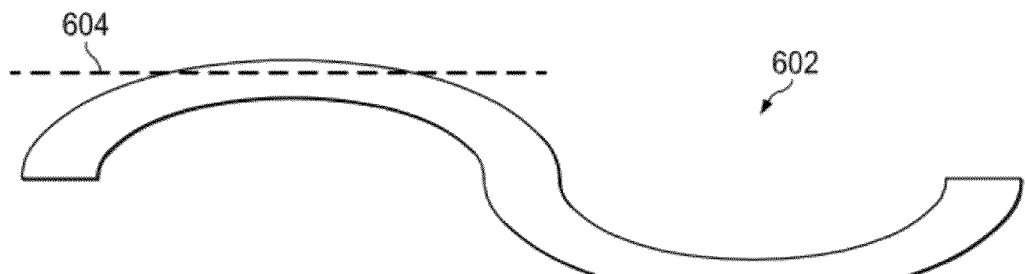
FIG. 6 (PRIOR ART) is a schematic of a glass wafer that is polished to reduce warp but by reducing warp this will at the same time also increase the TTV.
Figure 7A:
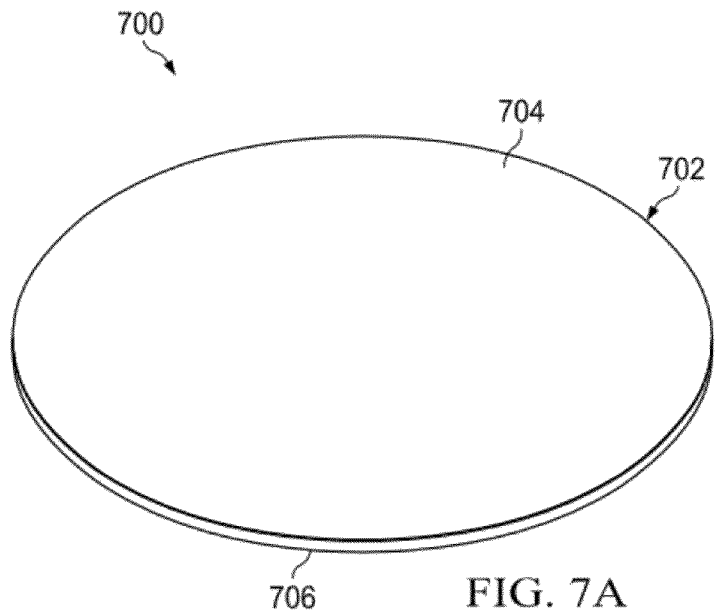
FIGS. 7A and 7B respectively show a perspective view and a side view of an exemplary non-polished glass wafer.
Figure 7B:
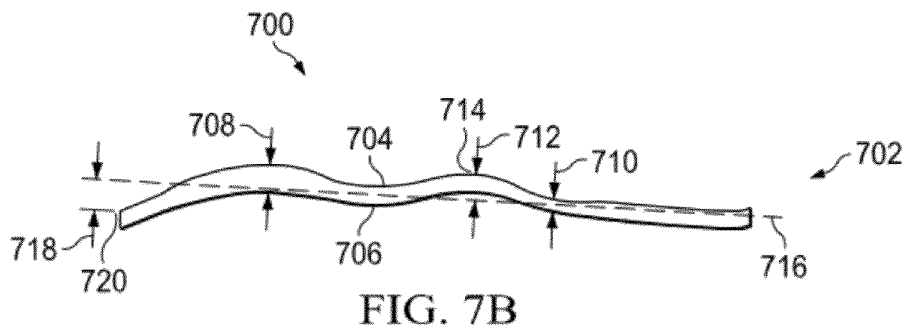

Referring to FIGS. 7A and 7B, there are respectively shown a perspective view and a side view of an exemplary non-polished glass wafer 700. As shown, the exemplary glass wafer 700 includes a body 702 that has a non-polished first surface 704 and a non-polished second surface 706 which are substantially parallel to each other. Although the body 702 is shown and described herein as being a circular body 702 it should be appreciated that the body 702 can also have any other shape such as rectangular, square, oval, or the like. Furthermore, the body 700 has a physical attribute that is referred to herein as the wafer quality index which is less than about 6.0, or less than about 4.5, or less than about 3.0. The wafer quality index is equal to TTV (µm) plus [warp (µm)/10]. The TTV is a difference between a highest thickness elevation 708 and a lowest thickness elevation 710 across the body 702 between the non-polished first surface 704 and the non-polished second surface 706. The warp is a sum of absolute values of a maximum distance 712 between a highest point 714 and a least squares focal plane 716 applied to a shape of the body 702 and a maximum distance 718 between a lowest point 720 and the least squares focal plane 716. The highest point 714 and the lowest point 720 are both with respect to same surface 704 or 706 of the glass wafer 700. The side view of the glass wafer 702 is not to scale and the dimensions have been greatly exaggerated so one can readily see the various features 708, 710, 712, 714, 716, 718 and 720 associated with warp and TTV.

The wafer quality index was developed because the individual attributes of TTV and warp are not only important by themselves, but the performance of the glass wafer 700 depends on the interrelationship of TTV and warp. Hence, the wafer quality index is characterized by both TTV and warp. As one example, many semiconductor customers today specify only TTV and have a cursory loose specification for warp. For instance, a semiconductor customer may specify that there be only a maximum warp of 100 µm across the glass wafer. However, this loose specification for warp negatively affects the performance of the glass wafer. Hence, the wafer quality index was developed to provide a far more valuable metric for predicting the performance of the glass wafer rather than just specifying TTV alone with a cursory loose specification for warp. In particular, by defining the wafer quality index, the major factors can be accounted for and useful predictions can be made concerning the quality of a thinned semiconductor wafer.

The glass wafer 700 can also have several physical and compositional attributes which are desirable so the glass wafer 700 can effectively be used to thin a semiconductor wafer. The various physical and compositional attributes can be as follows:

1. Coefficient of Thermal Expansion (CTE)—the glass wafer 700 could have a CTE in a range of about 3.0 ppm/° C.-3.5 ppm/° C. In this case, the CTEs of the glass wafer 700 and the semiconductor wafer would match or at least closely match one another which is often desirable because during the thinning process the glass wafer 700 will be bonded to the semiconductor wafer and the composite structure will likely undergo thermal cycling. An exemplary composition which can be used to make the glass wafer 700 so it has a CTE in the range of about 3.0 ppm/° C. to about 3.5 ppm/° C. has a nominal composition of (in mole percent on an oxide basis): $SiO_2$: 64.0-71.0; $Al_2O_3$: 9.0-12.0; $B_2O_3$: 7.0-12.0; MgO: 1.0-3.0; CaO: 6.0-11.5; SrO: 0-2.0; BaO: 0-0.1, wherein: (a) $1.00 \leq \Sigma[RO]/[Al_2O_3] \leq 1.25$, where $[Al_2O_3]$ is the mole percent of $Al_2O_3$ and $\Sigma[RO]$ equals the sum of the mole percents of MgO, CaO, SrO, and BaO; and (b) the glass has at least one of the following compositional characteristics: (i) on an oxide basis, the glass comprises at most 0.05 mole percent $Sb_2O_3$; and (ii) on an oxide basis, the glass comprises at least 0.01 mole percent $SnO_2$ (hereinafter this composition is referred to as "composition no. 1").

Figure 12:
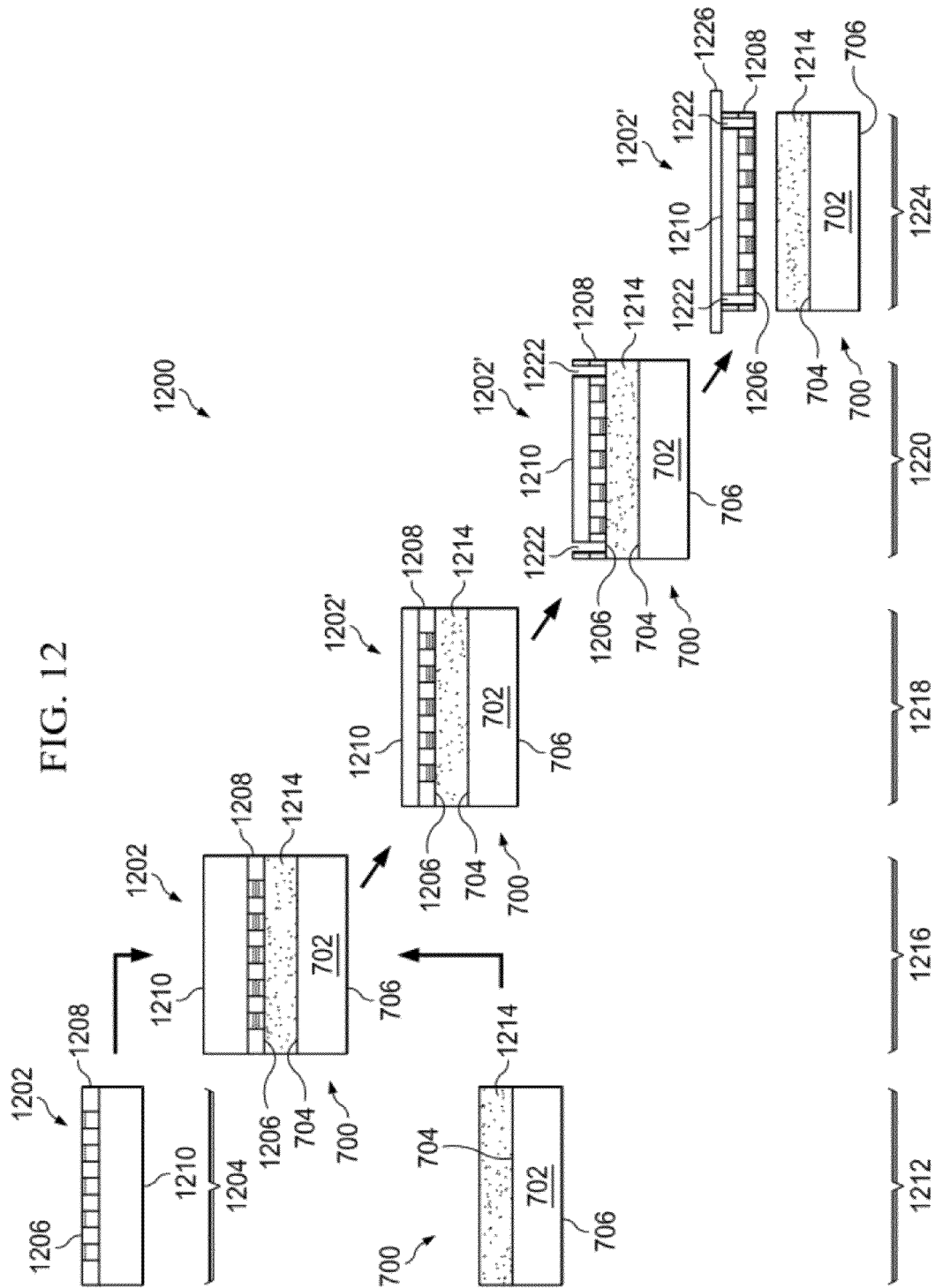
FIG. 12 is a diagram illustrating the basic steps associated with a method for using the non-polished glass wafer to thin a silicon wafer.

If desired, the glass wafer 700 can have a CTE that matches or at least closely matches that of the composite bonded structure including the silicon wafer with features plus the bonding adhesive (See FIG. 12). In this case, the glass wafer 700 would likely have a CTE different than 3.0 ppm/° C.-3.5 ppm/° C. which is not possible with a silicon carrier wafer which has a CTE of about 3.2 ppm/° C. To accomplish this, the glass wafer 700 can be made from different glass compositions so it would have different CTEs while all the other physical attributes such as the WQI, TTV, warp, size, thickness, and surface roughness would remain the same as the glass wafer 700 described above which has a CTE in the range of about 3.0 ppm/° C. to about 3.5 ppm/° C. For instance, an exemplary nominal glass composition which results in the glass wafer 700 having a CTE of about 6.0 ppm/° C. is 69.2 mol % $SiO_2$, 8.5 mol % $Al_2O_3$, 13.9 mol % $Na_2O$, 1.2 mol % $K_2O$, 6.5 mol % MgO, 0.5 mol % CaO, and 0.2 mol % $SnO_2$ (hereinafter this composition is referred to as "composition no. 2"). And, an exemplary nominal glass composition which results in the glass wafer 700 having a CTE of about 8.5 ppm/° C. is $61 \text{ mol }\% \leq SiO_2 \leq 75 \text{ mol }\%$; $7 \text{ mol }\% \leq Al_2O_3 \leq 15 \text{ mol }\%$; $0 \text{ mol }\% \leq B_2O_3 \leq 12 \text{ mol }\%$; $9 \text{ mol }\% \leq Na_2O \leq 21 \text{ mol }\%$; $0 \text{ mol }\% \leq K_2O \leq 4 \text{ mol }\%$; $0 \text{ mol }\% \leq MgO \leq 7 \text{ mol }\%$; and $0 \text{ mol }\% \leq CaO \leq 3 \text{ mol }\%$. The glass, in some embodiments, further comprises at least one fining agent such as, but not limited to, a halogen or a multivalent fining agent such as $As_2O_3$, $Sb_2O_3$, $SnO_2$, or $Fe_2O_3$. In a particular embodiment, the total concentration of $As_2O_3$ and $Sb_2O_3$, if either or both are present, is less than 500 ppm by weight (hereinafter this composition is referred to as "composition no. 3"). Another, an exemplary nominal composition which results in the glass wafer 700 having a CTE of about 10.0 ppm/° C. is a glass nominally comprising in mole percent on an oxide basis: $SiO_2$ 64.0-72.0; $Al_2O_3$ 9.0-16.0, $B_2O_3$ 1.0-5.0; $MgO+La_2O_3$ 1.0-7.5; CaO 2.0-7.5; SrO 0.0-4.5; BaO 1.0-7.0, wherein $\Sigma(MgO+CaO+SrO+BaO+3La_2O_3)/(Al_2O_3) \geq 1.15$, where $Al_2O_3$, MgO, CaO, SrO, BaO, and $La_2O_3$ represent the mole percents of the respective oxide components (hereinafter this composition is referred to as "composition no. 4"). In fact, depending on the composition, the glass wafer 700 can have any desired CTE which is in a range of about 3.0 ppm/° C. to about 12.0 ppm/° C.

2. TTV—the TTV of the semiconductor wafer can only be as good as the TTV of the glass wafer 700. Plus, as the semiconductor wafer's thickness requirements become smaller, the TTV of the glass wafer 700 must be smaller. Hence, in exemplary embodiments, the glass wafer 700 should have a TTV that is below about 2.0 µm or below about 1.0 µm.

3. Composition—metals, most notably sodium, can cause failures in IC's. Although the glass wafer 700 is not a final part of the IC structure, the degree of migration of sodium and other alkali from the glass wafer 700 to the semiconductor wafer is not yet known when the glass wafer 700 is bonded and then de-bonded from the semiconductor wafer during the thinning process. Therefore, the glass wafer 700 should avoid having metals altogether or at least to have them only at some trace level. For instance, the glass wafer should have less than about 0.05% weight percent of $Na_2O$ and $K_2O$.

The glass wafer 700 can be obtained by using any one of a variety of glass compositions. For example, the glass composition chosen can be any of a wide range of silicate, borosilicate, aluminosilicate, or boroaluminosilicate glass compositions, which optionally can comprise one or more alkali and/or alkaline earth modifiers. By way of illustration, one such glass composition includes the following constituents: 58-72 mole percent (mol %) $SiO_2$; 9-17 mol % $Al_2O_3$; 2-12 mol % $B_2O_3$; 8-16 mol % $Na_2O$; and 0-4 mol % $K_2O$, wherein the ratio $$\frac{Al_2O_3(mol\%) + B_2O_3(mol\%)}{\sum modifiers(mol\%)} > 1,$$

where the modifiers comprise alkali metal oxides. Another glass composition includes the following constituents: 61-75 mol % $SiO_2$; 7-15 mol % $Al_2O_3$; 0-12 mol % $B_2O_3$; 9-21 mol % $Na_2O$; 0-4 mol % $K_2O$; 0-7 mol % MgO; and 0-3 mol % CaO. Yet another illustrative glass composition includes the following constituents: 60-70 mol % $SiO_2$; 6-14 mol % $Al_2O_3$; 0-15 mol % $B_2O_3$; 0-15 mol % $Li_2O$; 0-20 mol % $Na_2O$; 0-10 mol % $K_2O$; 0-8 mol % MgO; 0-10 mol % CaO; 0-5 mol % $ZrO_2$; 0-1 mol % $SnO_2$; 0-1 mol % $CeO_2$; less than 50 parts per million (ppm) $As_2O_3$; and less than 50 ppm $Sb_2O_3$; wherein 12 mol % ≤ $Li_2O+Na_2O+K_2O$ ≤ 20 mol % and 0 mol % ≤ MgO+CaO ≤ 10 mol %. Still another illustrative glass composition includes the following constituents: 55-75 mol % $SiO_2$, 8-15 mol % $Al_2O_3$, 10-20 mol % $B_2O_3$; 0-8% MgO, 0-8 mol % CaO, 0-8 mol % SrO and 0-8 mol % BaO. Further, the substrate optionally can be annealed and/or strengthened (e.g., by thermal tempering, chemical ion-exchange, or like processes).

4. Warp—the warp of the glass wafer 700 can greatly affect the performance/properties of the thinned semiconductor wafer. The glass wafer 700 should have a warp that is less than about 60 µm, or less than 30 µm, or less than 20 µm.

5. Size—the size of the "quality area" of the glass wafer 700 with a circular body 702 should be able to reach about 300 mm outer diameter, and scale to about 450 mm to match the larger semiconductor wafers in the coming years. In particular, the glass wafer 700 with a circular body 702 should have an outer diameter in the range of about 150 mm to about 450 mm.

6. Thickness—the glass wafer 700 should have a thickness that is nominally about 0.7 mm but no less than about 0.4 mm and no greater than about 1.1 mm.

7. Surface roughness—the glass wafer 700 should have a very low surface roughness to improve surface adhesion of the bonding agent used to attach the glass wafer 700 to the semiconductor wafer. In addition, the glass wafer 700 should have a very low surface roughness to improve number of re-cycles or number of times the glass wafer 700 can be used in a thinning process. In particular, the glass wafer 700 should have a very low surface roughness because microcracking and microcorrugation can lead to accelerated damage during the cleaning cycle, which frequently uses a hydrogen fluoride (HF) solution. In certain embodiments, the glass wafer 700 has a RMS (Root Mean Square) surface roughness that is less than or equal to about 5 Angstroms (Å).

Figure 8A:
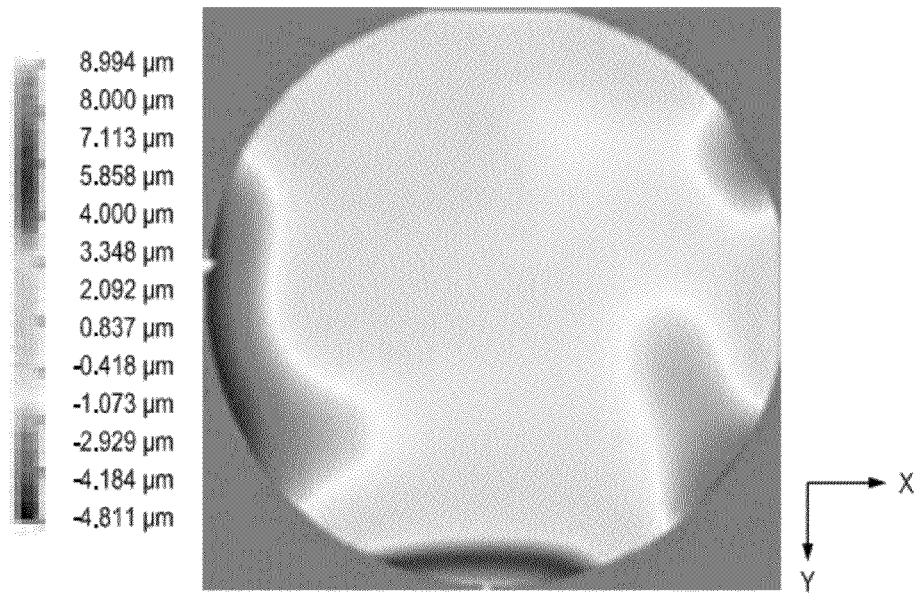
FIGS. 8A-8D are several diagrams illustrating the warp (flatness) and TTV of an exemplary non-polished glass wafer.
Figure 8B:
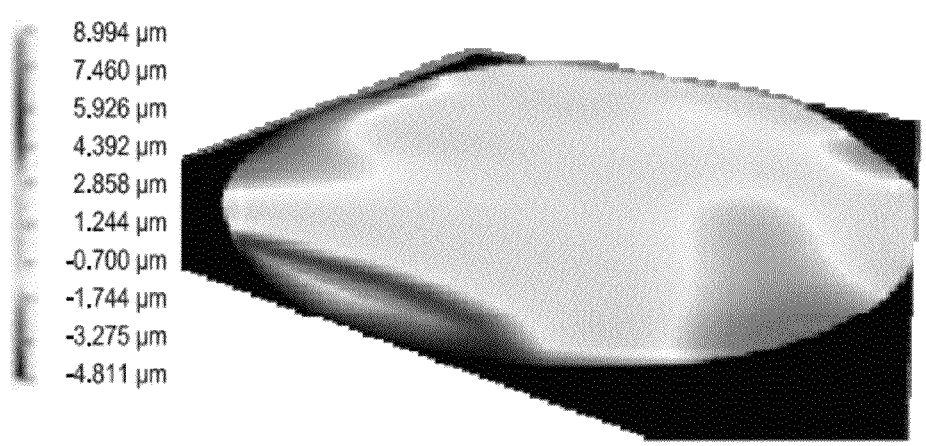
Figure 8C:
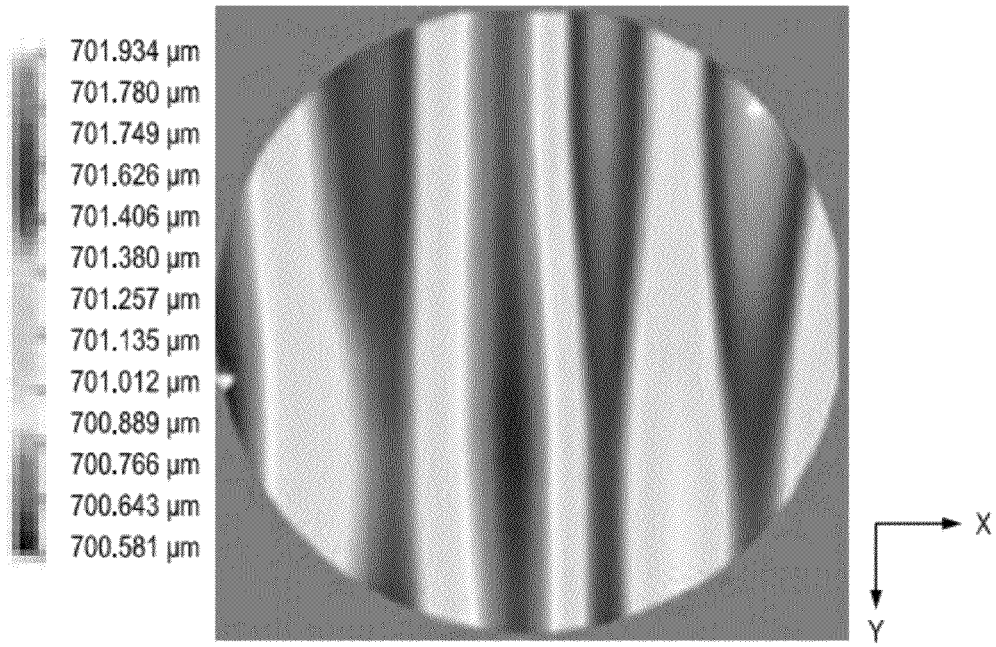
Figure 8D:
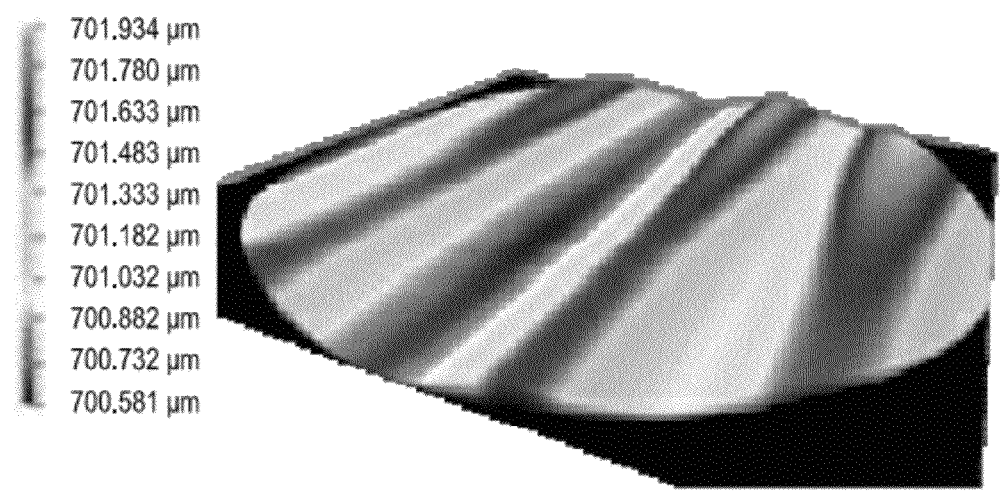

Referring to FIGS. 8A-8D, there are several diagrams illustrating the warp (flatness) and TTV of an exemplary non-polished glass wafer 700. FIGS. 8A-8B are respectively a top view and an isometric view illustrating the flatness/warp (Zernike fit map) @ 1000× of the exemplary glass wafer 700. FIGS. 8C-8D are respectively a top view and an isometric view illustrating the TTV thickness (thickness/parallelism) @ 1000× of the exemplary glass wafer 700. This exemplary glass wafer 700 had a 300 mm outer diameter, a nominal thickness of about 0.7 mm. This particular glass wafer 700 and 87 other glass wafers 700 were made using the aforementioned composition no. 1 in a glass manufacturing system, which uses a fusion process as discussed below.

TABLE 1 represents the average TTV and the average warp of all 88 glass wafers 700 which had the aforementioned composition no. 1 to highlight the repeatability and capability of the glass manufacturing system.

TABLE 1

|  | TTV | Warp |
| --- | --- | --- |
| Target | 2.0 µm | 30.0 µm |
| Average | 1.4 µm | 17.4 µm |
| Maximum | 2.0 µm | 29.1 µm |
| Minimum | 1.1 µm | 6.5 µm |
| Standard Deviation | 0.2 µm | 5.3 µm |
| Cp | 1.9 | 0.9 |

The data that was generated for these measurements involved over 3 million data points for each exemplary glass wafer 700 and has an accuracy of 0.10 µm for TTV and 0.5 µm for warp.

Figure 9A:
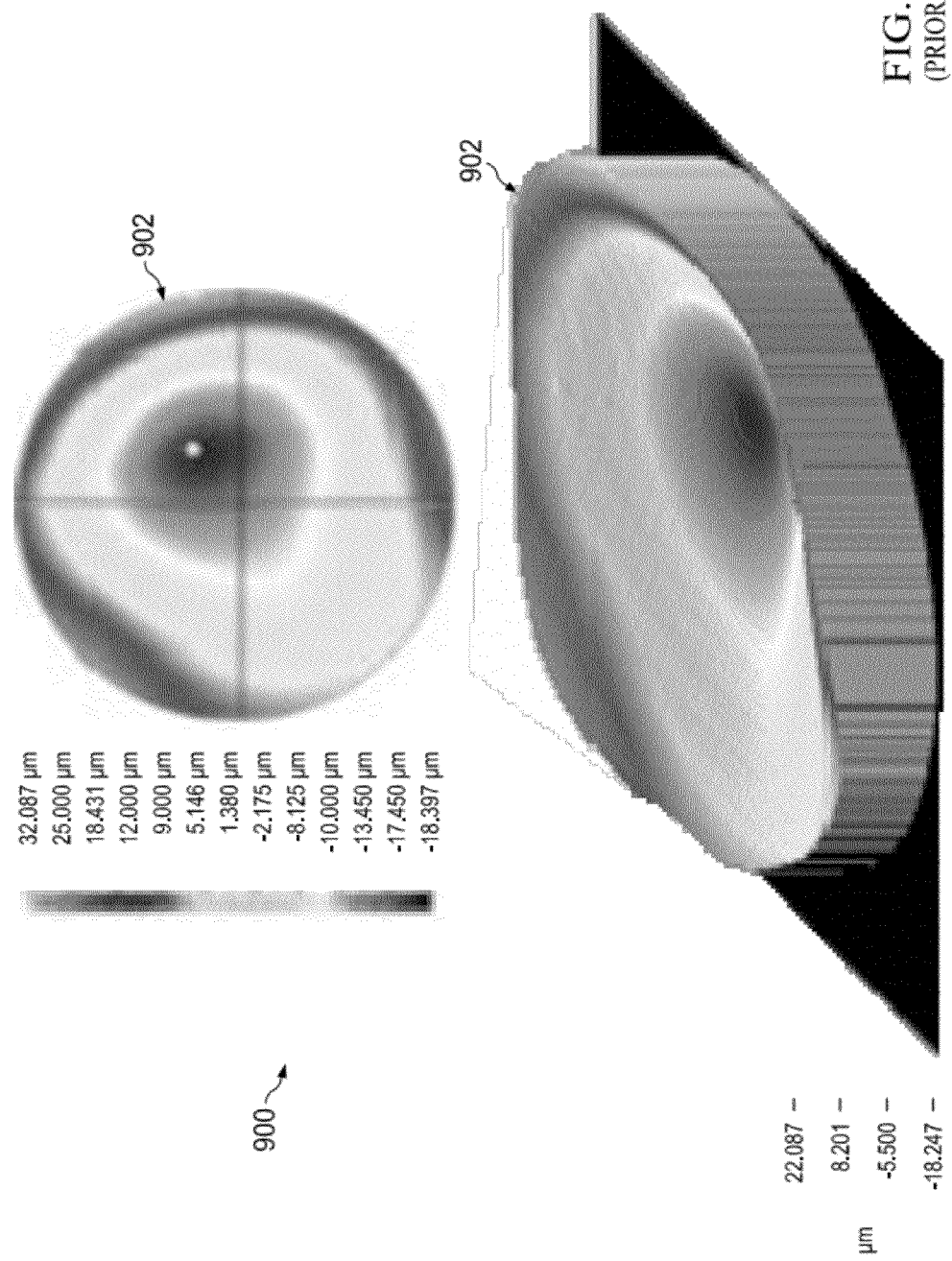
FIGS. 9A-9B (PRIOR ART) are two diagrams illustrating the warp (flatness) of a first side and a second side of a traditional polished glass wafer with a 200 mm outer diameter.
Figure 9B:
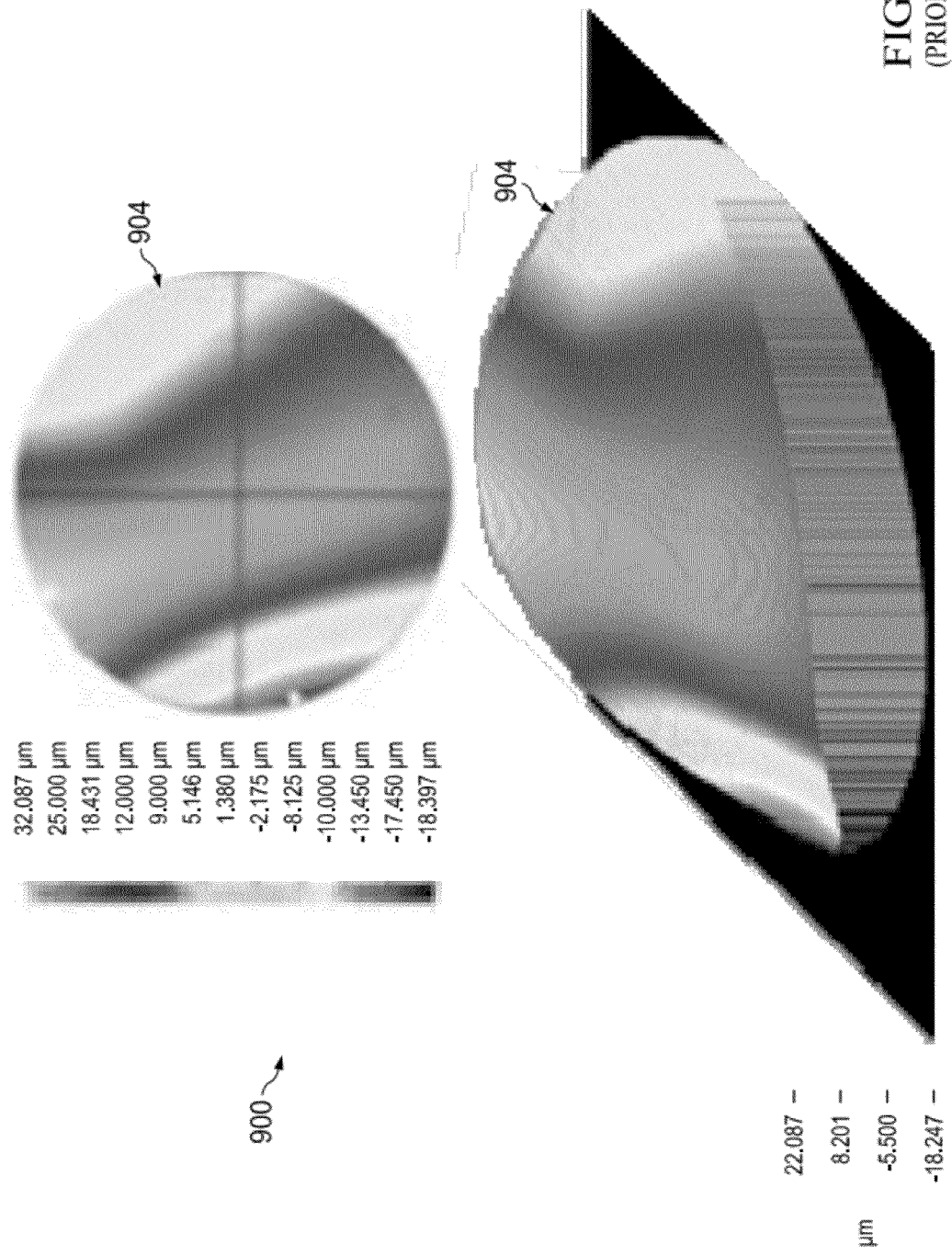

Referring to FIGS. 9A-9B (PRIOR ART), there are two diagrams illustrating the warp (flatness) of a first side 902 and a second side 904 of a traditional polished glass wafer 900 with a 200 mm outer diameter. In particular, FIG. 9A shows a top view (upper) and an isometric view (lower) of the first side 902 of the traditional polished glass wafer 900 where the first side 902 had a warp of about 41 µm. FIG. 9B shows a top view (upper) and an isometric view (lower) of the second side 904 of the traditional polished glass wafer 900 where the second side 904 had a warp of about 105 µm. The traditional polished glass wafer 900 was made from 0.7 mm thick commercially-available borosilicate glass material. The traditional polished glass wafer 900 had substantially more warp than the exemplary glass wafers 700 associated with FIGS. 8A-8D even when the exemplary glass wafers 700 had a 300 mm outer diameter while the traditional polished glass wafer 900 has a 200 mm outer diameter.

Figure 10A:
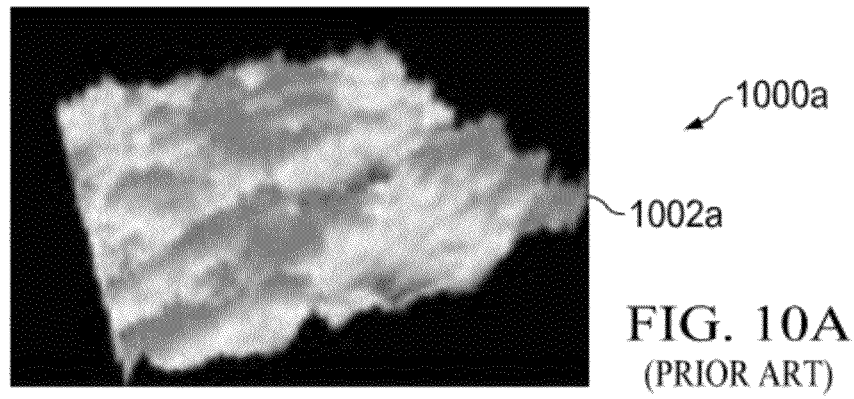
FIGS. 10A-10C are three diagrams respectively illustrating the surface roughness of a portion of two traditional polished glass wafers and an exemplary non-polished glass wafer.
Figure 10B:
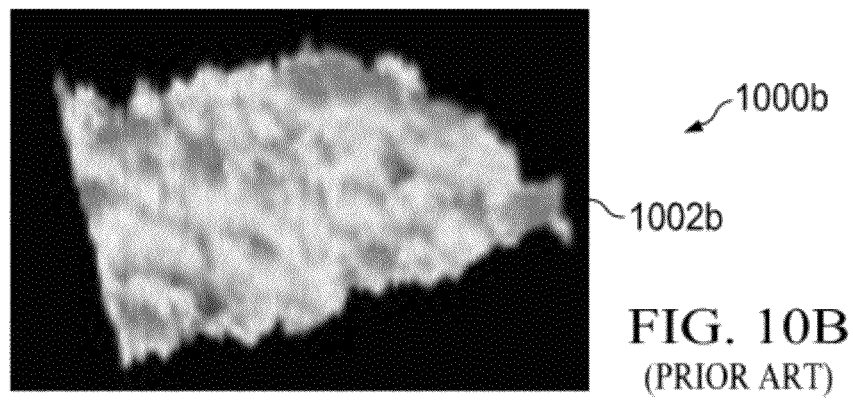
Figure 10C:
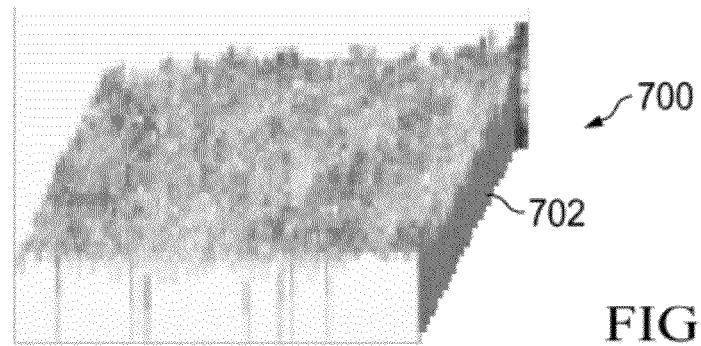

Referring to FIGS. 10A-10C, there are three diagrams respectively illustrating the surface roughness of a portion of two traditional polished glass wafers 1000a and 1000b and an exemplary non-polished glass wafer 700. The first traditional glass wafer 1000a had a first side 1002a with a surface roughness of about 5.8 Å. The second traditional glass wafer 1000b had a first side 1002b with a surface roughness of about 6.1 Å. In contrast, the exemplary glass wafer 700 had a non-polished first surface 702 with a surface roughness of about 2.5 Å. The traditional polished glass wafers 1000a and 1000b were made from 0.7 mm thick commercially-available borosilicate glass while the exemplary glass wafer 700 was made from 0.7 mm thick glass based on the aforementioned composition no. 1. The exemplary glass wafer 700 had a surface roughness that is substantially less than the surface roughness of the two traditional polished glass wafers 1000a and 1000b. The smaller surface roughness (less microcracks) of the exemplary glass wafer 700 is desirable for several reasons such as increasing the strength of the glass wafer 700 and increasing the number of times the glass wafer 700 can be re-used in a thinning process. The strength of the glass wafer 700 was found to be dependent more on the surface quality rather than the bulk properties of the glass wafer 700.

Figure 11:
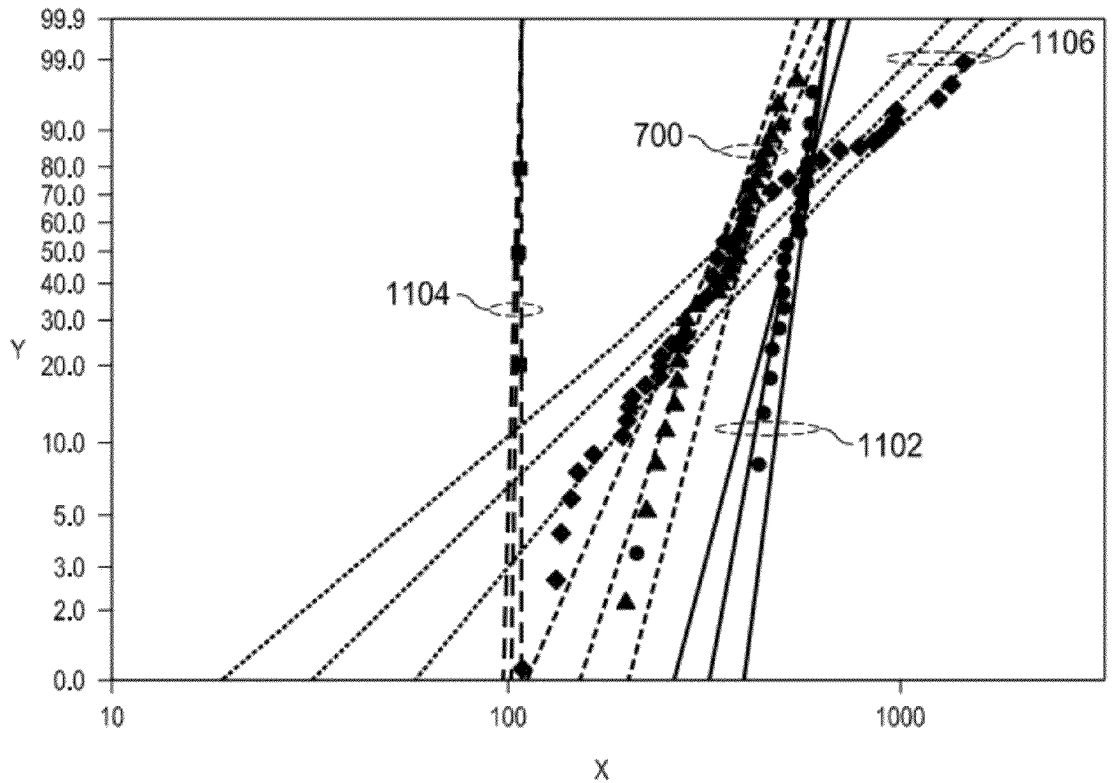
FIG. 11 is a graph used to illustrate the strengths of three traditional silicon wafers compared to an exemplary non-polished glass wafer.

Referring to FIG. 11, there is a graph used to illustrate the strengths as measured of three traditional silicon carrier wafers 1102, 1104, and 1106 compared to the exemplary non-polished glass wafer 700. In this graph, the y-axis represents the probability of failure (%) and the x-axis represents the load in megaPascals (MPa). The first traditional silicon carrier wafer 1102 had a 100 mm outer diameter polished surface and was 520 μm thick. The second traditional silicon carrier wafer 1104 had a 100 mm outer diameter ground surface and was 520 μm thick. The third traditional silicon carrier wafer 1106 had a 300 mm outer diameter polished surface and was 780 μm thick. The exemplary glass wafer 700 was made from the aforementioned composition no. 1 and had a 300 mm outer diameter with non-polished surfaces 704 and 706 and was about 0.5 mm thick. The load was 0.5 inches in dimension, and a 1 inch base was used to support the traditional silicon wafers 1102, 1104 and 1106 and the exemplary glass wafer 700.

Referring to FIG. 12, there is a diagram illustrating the basic steps associated with a method 1200 for using the non-polished glass wafer 700 to thin a silicon wafer 1202. At step 1204, the silicon wafer 1202 is provided which has a first surface 1206 with a circuit die 1208 formed therein and a second surface 1210 where the first surface 1206 and the second surface 1210 are substantially parallel to each other. The circuit die 1208 can be formed in the silicon wafer 1202 by a photolithography process.

At step 1212, the glass wafer 700 is provided which in this example has the circular body 702 with the non-polished first surface 704 and the non-polished second surface 706 that are substantially parallel to each other (see description above for details about the wafer quality index and other exemplary attributes of the glass wafer 700). In this example, the glass wafer's non-polished first surface 702 has a bonding agent 1214 that was applied thereto by, for instance, a spin coating process. Alternatively, the silicon wafer's first surface 1206 could have the bonding agent 1214 applied thereto for instance by a spin coating process.

At step 1216, the silicon wafer 1202 is placed next to the glass wafer 700 so the bonding agent 1214 bonds the silicon wafer's first surface 1206 to the glass wafer's non-polished first surface 704. In one example, an ultraviolet light may be directed through the glass wafer's non-polished second surface 706 to cure the bonding agent 1214 such that the silicon wafer's first surface 1206 is bonded to the glass wafer's non-polished first surface 704. In another example, a thermally cured temporary adhesive bonding agent 1214 might be used to bond the silicon wafer 1202 to the glass wafer 700. Alternatively, the bonding agent 1214 could utilize other mechanisms (e.g., polymerization, exposure to air, chemical reaction between components of the bonding agent 114, or the like) to facilitate bond formation between the silicon wafer 1202 to the glass wafer 700.

At step 1218, the silicon wafer's second surface 1210 is thinned while the silicon wafer 1202 is bonded to the glass wafer 700. There are several ways that the silicon wafer 1202 can be thinned including using, for example, a mechanical grinding device, a chemical mechanical polishing device, an etching device (e.g., within a solvent bath) or any combination of these techniques. The silicon wafer 1202 can have an original thickness of around 700 μm and be thinned to a thickness of around 50 μm-60 μm. In any case, regardless of the thinning technique used the quality of the glass wafer 700 ultimately leads to the quality of the thinned silicon wafer 1202. An exemplary thinning system 1300 which uses a thinning mechanism 1306 to thin the silicon wafer 1202 while it is bonded to the glass wafer 700 is described below with respect to FIG. 13.

At step 1220, the thinned silicon wafer 1202' can be further processed if needed for instance by forming precision holes 1222 (two shown) therein which will function as future vertical interconnects when making the 3D IC. After the precision holes 1222 are formed then they can be metalized.

At step 1224, the thinned silicon wafer 1202' is separated (de-bonded) from the glass wafer 700. In one case, dicing tape 1226 (laminating tape 1226 etc.) can be applied to the silicon wafer's second surface 1210 and then used to help pull and separate the thinned silicon wafer 1202' from the bonding agent 1214 and glass wafer 700. Alternatively, a laser can emit a laser beam through the glass wafer's non-polished second surface 706 to selectively remove or destroy the bonding agent 1214. In another example, if a thermally cured temporary adhesive bonding agent 1214 is used then this bonding agent 1214 could be heated to release the thinned silicon wafer 1202' from the glass wafer 700. Alternatively, a solvent could be used to release the thinned silicon wafer 1202' from the glass wafer 700.

Figure 13:
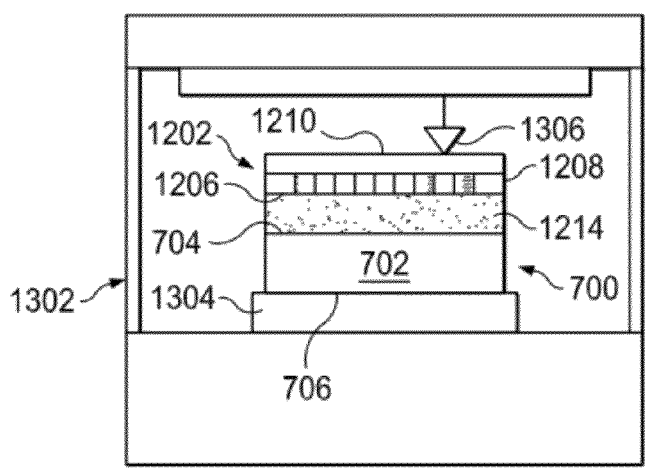
FIG. 13 is a block diagram of an exemplary thinning system which uses a thinning mechanism to thin a silicon wafer while it is bonded to the non-polished glass wafer.

Referring to FIG. 13, there is a block diagram of an exemplary thinning system 1300 which uses a thinning mechanism 1306 to thin the silicon wafer 1202 while it is bonded to the non-polished glass wafer 700. The thinning system 1300 includes an enclosure 1302 within which there is located at least a support 1304 (e.g., vacuum 1304, electrostatic chuck 1304), and the thinning mechanism 1306. The glass wafer's second surface 706 is placed on and secured to the support 1304. Prior to this step, the glass wafer 700 would have already been bonded to the silicon wafer 1202 by the bonding agent 1214 (see also description above for details about the wafer quality index and other exemplary attributes of the glass wafer 700). The thinning mechanism 1306 (e.g., mechanical grinding device (shown), chemical mechanical polishing device, etching device) then operates to thin the silicon wafer's second surface 1210 while the silicon wafer 1202 is bonded to the glass wafer 700. The silicon wafer 1202 can have an original thickness of around 700 μm and be thinned to a thickness of around 50 μm-60 μm. In any case, regardless of the type of thinning mechanism 1306 used the quality of the glass wafer 700 ultimately leads to the quality of the thinned silicon wafer 1202.

From the foregoing, one skilled in the art will appreciate that the present disclosure includes the non-polished glass wafer 700, the thinning system 1300, and the method 1200 for using the glass wafer 700 to thin a semiconductor wafer 1202. As described above, glass wafers 700 have been cost effectively manufactured which have an outer diameter of about 300 mm and are about 0.7 mm thick with a TTV less than about 2.0 μm and warp less than about 30 μm without polishing. This is very significant for the 3D IC packaging technology not just from a cost standpoint but also from an improved attribute standpoint, an improved cleaning standpoint, an improved re-use standpoint, as well as from an improved bond/de-bond standpoint. The following is a list of some of the potential advantageous features associated with the non-polished glass wafer 700:

1. Exceptional Low Cost—no polishing steps are needed when a fusion process is used, to make the glass wafers 700.

2. Simultaneous low TTV and low warp can improve yields and capabilities for thinned silicon wafers 1202.

3. The glass wafers 700 can have exceptionally low surface roughness and reduced subsurface damage when compared to traditional polished glass wafers.

4. The glass wafers 700 can be made, as one example, from the aforementioned composition no. 1 that has desirable features such as:
   a. CTE match to silicon.
   b. Low alkali metals—Na concentrations are about 2 orders of magnitude less than traditional polished glass wafers made from borosilicate glass.
   c. Strength—testing has demonstrated that the glass wafers 700 are as strong as silicon wafers 1202, and stronger than traditional polished glass wafers made from borosilicate glass.

The following is a discussion about an exemplary glass manufacturing system that can make the glass sheets from which are cut multiple glass wafers 700 that have the non-polished first and second surfaces 704 and 706, the wafer quality index less than 6.0, and one or more of the aforementioned physical and compositional attributes which make them very useful in thinning a semiconductor wafer. The exemplary glass manufacturing system utilizes a glass forming process known as the overflow down-draw or fusion process where the two surfaces of the glass sheet are formed in air so no polishing of the two surfaces is required. One exemplary glass manufacturing system that uses the overflow down-draw or fusion process to make a glass sheet that can be cut to form multiple glass wafers 700 is described below with respect to FIGS. 14 and 15.

Figure 14:
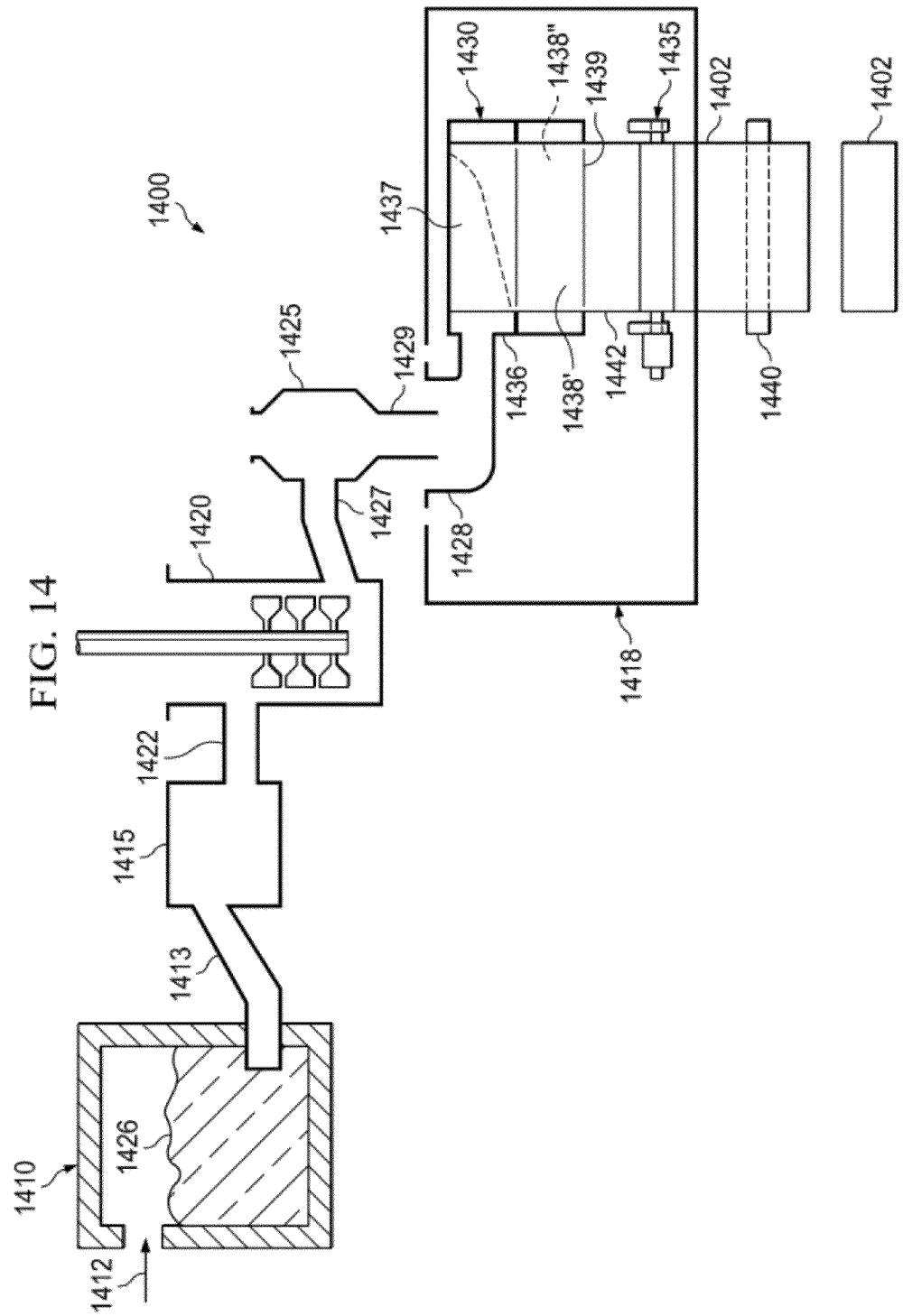
FIG. 14 is a schematic view of an exemplary glass manufacturing system that uses the fusion process and a forming body (e.g., isopipe) to manufacture a non-polished glass sheet which can be cut to form a non-polished glass wafer.

Referring to FIG. 14, there is a schematic view of an exemplary glass manufacturing system 1400 which uses a fusion draw process to manufacture a non-polished glass sheet 1402 that can be cut and further processed to form the glass wafer 700. The exemplary glass manufacturing system 1400 includes a melting vessel 1410, a fining vessel 1415, a mixing vessel 1420 (e.g., stir chamber 1420), a delivery vessel 1425 (e.g., bowl 1425), a fusion draw machine 1418 (which includes an inlet 1428, an isopipe 1430, and a pull roll assembly 1435), and a traveling anvil machine 1440. The melting vessel 1410 is where glass batch materials are introduced, as shown by arrow 1412, and melted to form molten glass 1426. The fining vessel 1415 (i.e., finer tube 1415) has a high temperature processing area that receives the molten glass 1426 (not shown at this point) via a refractory tube 1413 from the melting vessel 1410 and in which bubbles are removed from the molten glass 1426. The fining vessel 1415 is connected to the mixing vessel 1420 (i.e., stir chamber 1420) by a finer to stir chamber connecting tube 1422. The mixing vessel 1420 is connected to the delivery vessel 1425 by a stir chamber to bowl connecting tube 1427. The delivery vessel 1425 delivers the molten glass 1426 through a downcorner 1429 to the inlet 1428 and into the isopipe 1430 (forming body 1430). The isopipe 1430 includes an inlet 1436 that receives the molten glass 1426 which flows into a trough 1437 and then overflows and runs down two sides 1438' and 1438" before fusing together at what is known as a root 1439 (see FIG. 15). The root 1439 is where the two sides 1438' and 1438" come together and where the two overflow walls of the molten glass 1426 rejoin (i.e., re-fuse) before being drawn downward between two rolls in the pull roll assembly 1435 to form the glass sheet 1402. The traveling anvil machine 1440 then cuts the glass sheet 1402 into distinct glass sheets 1402 which are later cut into the desired shape for the glass wafer 700. A more detailed discussion about an exemplary configuration of the isopipe 1430 is provided next with respect to FIG. 15.

Figure 15:
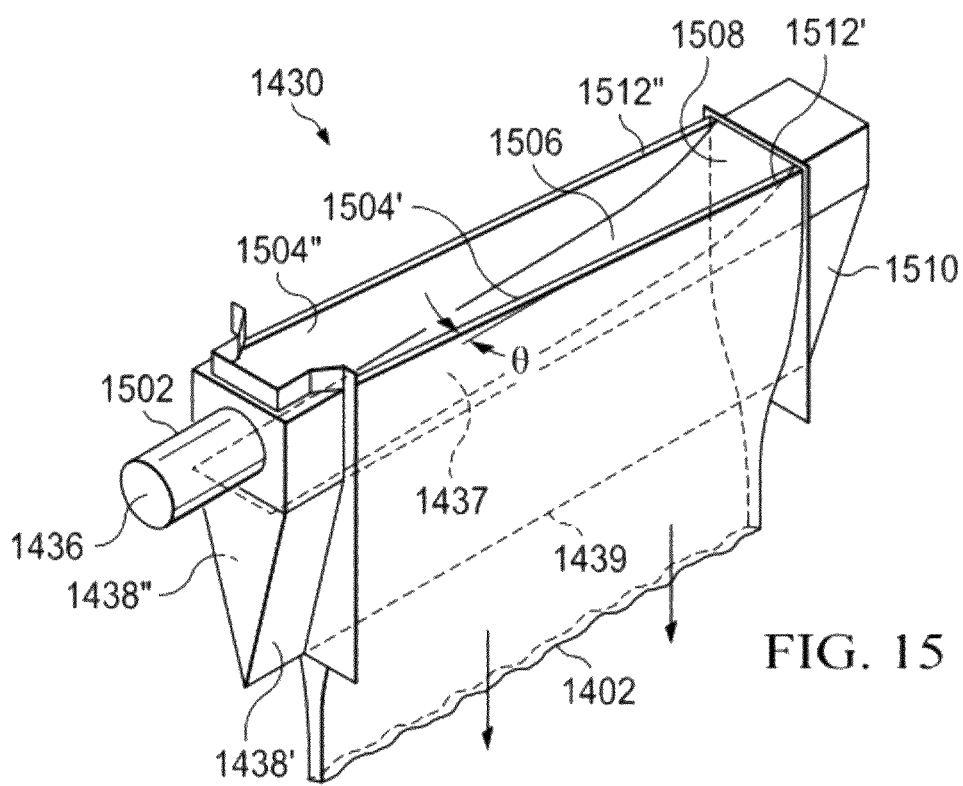
FIG. 15 is a perspective view illustrating in greater detail the forming body (e.g., isopipe) shown in FIG. 14.

Referring to FIG. 15, there is a perspective view of the exemplary isopipe 1430 (forming body 1430) that can be used to form the glass sheet 1402. The isopipe 1430 includes a feed pipe 1502 that provides the molten glass 1426 through the inlet 1436 to the trough 1437. The trough 1437 is bounded by interior side-walls 1504' and 1504" that are shown to have a substantially perpendicular relationship, but could have any type of relationship to a bottom surface 1506. In this example, the isopipe 1430 has a bottom surface 1506 which has a sharp decreasing height contour near the end 1508 farthest from the inlet 1436. If desired, the isopipe 1430 can have a bottom surface 1506, which has located thereon an embedded object (embedded plow) near the end 1408 farthest from the inlet 1436.

The exemplary isopipe 1430 has a cuneiform/wedge-shaped body 1510 with the oppositely disposed converging side-walls 1438' and 1438". The trough 1437 having the bottom surface 1506, and possibly the embedded object (not shown), is longitudinally located on the upper surface of the wedge-shaped body 1510. The bottom surface 1506 and embedded object (if used) both have mathematically described patterns that become shallow at end 1508, which is the end the farthest from the inlet 1436. As shown, the height between the bottom surface 1506 and the top surfaces 1512' and 1512" of the trough 1437 decreases as one moves away from the inlet 1436 towards the end 1508. However, it should be appreciated that the height can vary in any manner between the bottom surface 1506 and the top surfaces 1512' and 1512". It should also be appreciated that the cuneiform/wedge-shaped body 1510 may be pivotally adjusted by a device such as an adjustable roller, wedge, cam or other device (not shown) to provide a desired tilt angle shown as θ which is the angular variation from the horizontal of the parallel top surfaces 1512' and 1512".

In operation, the molten glass 1426 enters the trough 1437 through the feed pipe 1502 and inlet 1436. Then the molten glass 1426 wells over the parallel top surfaces 1512' and 1512" of the trough 1437, divides, and flows down each side of the oppositely disposed converging sidewalls 1438' and 1438" of the wedge-shaped body 1510. At the bottom of the wedge portion, or root 1439, the divided molten glass 1426 rejoins to form the glass sheet 1402 which has very flat and smooth non-polished surfaces. The high surface quality of the glass sheet 1402 results from a free surface of molten glass 1426 that divides and flows down the oppositely disposed converging side-walls 1438' and 1438" and forming the exterior surfaces of the glass sheet 1402 without coming into contact with the outside of the isopipe 1430.

For a more detailed discussion of the general parameters of the overflow down-draw process for making thin glass sheets, reference is made to one or more of the following co-assigned, co-owned patents and/or applications, the relevant contents thereof are incorporated herein by reference in their entirety:

WO03/014032 entitled "SHEET GLASS FORMING APPARATUS;"

WO05/081888 entitled "SHEET WIDTH CONTROL FOR OVERFLOW DOWNDRAW SHEET GLASS FORMING APPARATUS;"

WO09/070,262 entitled "METHOD FOR DETECTING CHANGE IN SHAPE OF A MOVING SUBSTRATE;"

US-2010-0212360A1 entitled "APPARATUS AND METHOD FOR DRAWING A RIBBON OF GLASS;" and US-2011-0289969A1 entitled "APPARATUS AND METHOD FOR CONTROLLING THICKNESS OF A FLOWING RIBBON OF MOLTEN GLASS."

The exemplary glass manufacturing system 1400 or any other down-draw process glass manufacturing system can have one or more enhancements made thereto to better control the final thickness of the non-polished glass sheet 1402 which can be cut to form the glass wafer 700. An example of one such enhancement that was made to the exemplary glass manufacturing system 1400 (but can be made to any other down-draw process glass manufacturing system) to make non-polished glass sheets 1402 which can be cut to form the glass wafers 700 that have the desired wafer quality index requirements specified herein is described next with respect to FIG. 16.

Figure 16:
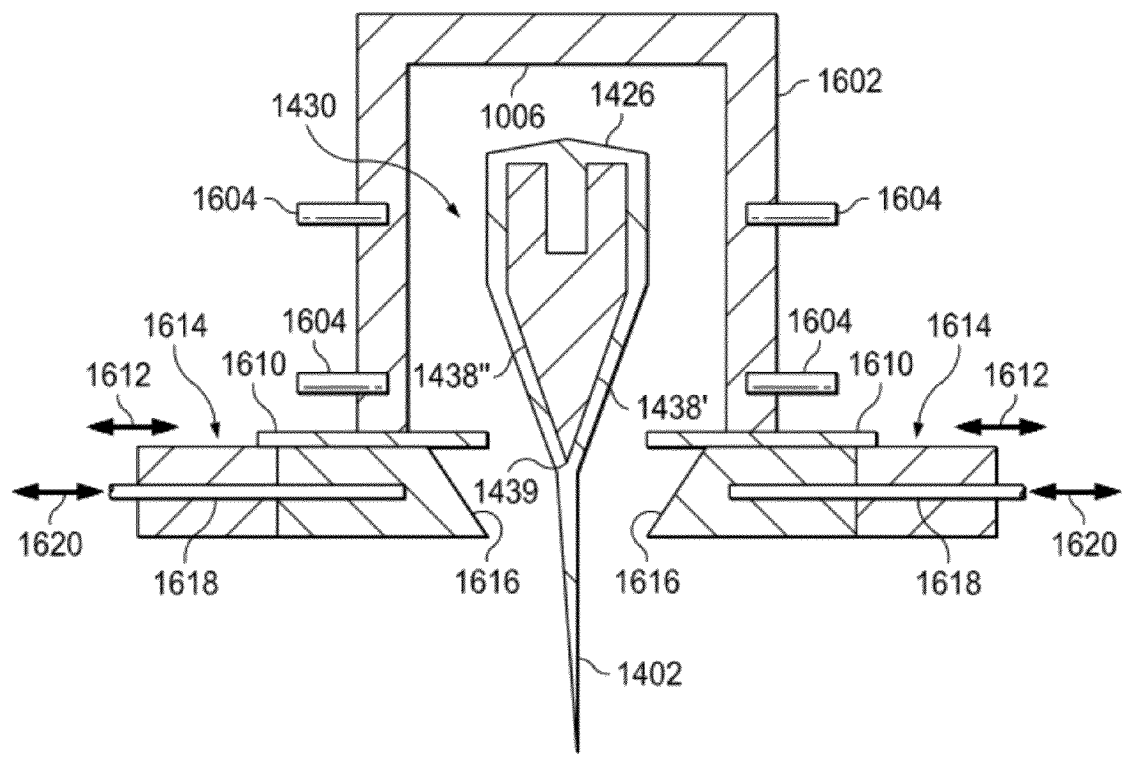
FIG. 16 is a cross sectional side view of an enhancement that can be made with respect to the forming body (e.g., isopipe) shown in FIGS. 14-15 which can help better control the final thickness of the non-polished glass sheet that can be cut to form the non-polished glass wafer.

Referring to FIG. 16, there is a cross sectional side view of an enhancement that can be made with respect to the isopipe 1430 (e.g., forming body 1430) shown in FIGS. 14-15 that can help better control the final thickness of the non-polished glass sheet 1402 which can be cut to form the non-polished glass wafer 700. The isopipe 1430 is comprised of a ceramic refractory material, such as zircon or alumina and housed in enclosure 1602. The enclosure 1602 comprises heating elements 1604 arranged behind interior walls 1606 (muffle 1606). The heating elements 1604 are used to control the temperature of the molten glass 1426 on the forming surfaces 1438' and 1438" of the isopipe 1430, and hence the viscosity of the molten glass 1426, and may be arranged throughout the enclosure 1602 as needed. The heating elements 1604 are in banks arranged vertically so that the temperature within the enclosure 1602 can be controlled as a function of vertical position in the enclosure 1602.

To provide control of the thermal environment within the enclosure 1602, and in particular the temperature at the root 1439 of the isopipe 1430, thermal shields 1610 are positioned below the enclosure 1602 and are movable in a horizontal direction as indicated by arrows 1612. The thermal shields 1610 are used to control radiative heat loss from the isopipe 1430, and in particular radiative heat loss from the root 1439 region of the isopipe 1430. The thermal shields 1610 are independently movable in the horizontal direction as indicated by arrows 1612, wherein the thermal shields 1610 translate to increase or decrease the gap (opening) between the thermal shields 1610. In particular, one thermal shield 1610 is movable independently from the opposite thermal shield 1610 (on the other side of the glass sheet 1402). More specifically, the thermal shields 1610 are capable of movement, toward the glass sheet 1402, and outward, away from the glass sheet 1402. The movement toward or away from the glass sheet 1402 can be provided for in several different ways.

In addition, to further help control the thermal environment within the enclosure 1602, and in particular the temperature at the root 1439 of the isopipe 1430, cooling members 1614 are located below the thermal shields 1610. If desired, the cooling members 1614 could be located above the thermal shields 1610. The cooling members 1614 may be movable so that the cooling members 1614 can be positioned an appropriate distance from descending glass sheet 1402. The cooling members 1614 contain cooling equipment that cools the surfaces of the cooling members 1614 and in particular the faces 1616 of the cooling members 1614. The cooling of the cooling member's faces 1616 in turn controls the temperature and therefore the viscosity of the glass descending from the forming body 1430 along the width of the glass (e.g. horizontally). For example, the cooling members 1614 may contain one or more coolant supply lines 1618 which have outlets that extend along the length of the cooling members 1614. Each outlet emits a coolant (e.g., air) that cools a portion of each cooling member's face 1616 adjacent to the outlet. The volume of coolant emitted by each outlet may be individually controlled so that the temperature of each cooling member's face 1616 can be controlled as a function of location on the face 1616 (e.g. horizontal location). In some embodiments, a single supply line 1618 may feed a header comprising a plurality of outlets, each outlet being controlled by a remotely controlled valve.

The cooling arrangement described above allows the cooling member's faces 1616 to vary the temperature and viscosity of the glass descending from the forming body 1430 as a function of location across the width of the glass sheet 1402, and can be used, for example, to control the across-the-sheet thickness of the glass sheet 1402. While the cooling members 1614 are capable of horizontal translation (represented by arrows 1620) to enable positioning the cooling members 1614 relative to the major surfaces of the glass sheet 1402, once an optimum position is set, the cooling members 1614 are seldom moved, since such movement can affect sheet attributes (e.g. shape, thickness, and the like). Rather, the functionality of the cooling members 1614 is derived largely by controlling the flow of coolant to the cooling members 1614 and therefore temperature. The optimum position depends on the particular draw setup, and may vary from draw to draw.

As can be appreciated by the above description, both cooling and heating can occur simultaneously in regions quite close to each other. In this regard, the thermal shields 1610 minimize radiant heat loss from the bottom of the forming body 1430 to prevent cooling of the molten glass 1426 at the root 1439 of the forming body 1430, while the cooling members 1614 are used to actively cool the glass across a width of the descending glass sheet 1402 as an aid to thickness control. Indeed, the operation of the thermal shields 1610 and the cooling members 1614 can be coordinated to maintain a specific thermal environment. For a more detailed description about the enclosure 1602, the thermal shields 610, the cooling members 614 and the associated components reference is made to EP Published Patent Application No. EP2253598, entitled "APPARATUS FOR REDUCING RADIATIVE HEAT LOSS FROM A FORMING BODY IN A GLASS FORMING PROCESS" the contents of which are incorporated by reference herein.

Furthermore, to help manufacture glass sheets 1402 that are cut into glass wafers 700 which not only achieve the desired wafer quality index requirements but also result in a 2 μm TTV or less one can further fine-tune or monitor certain components of the set-up shown in FIG. 16 to provide more extensive control of heat transfer since even the slightest irregularity can manifest itself as a thickness variation in the glass sheet 1402. In achieving a TTV of less than or equal to about 2 μm, the following heat transfer improvements could be made:

A. Control of pressure in enclosure 1602 (opening between thermal shields 1610): It is possible to control and minimize any pressure variations or significant pressure differences relative to the interior and exterior of the enclosure 1602 by adjusting the opening between the thermal shields 1610, where if there are pressure variations this could lead to uneven heat transfer which in turn leads to increased warpage and thickness variation in the glass sheet 1402.

B. Control of cooling members 1614: It is possible to provide material and air flow control units for precision control and velocity of the cooling air to control the cooling as a function of the location on the cooling member's faces 1616.

C. Muffle Door Slide Gate: In addition to controlling pressure within the enclosure 1602 through exhaust as mentioned above, it is possible to minimize the opening between the thermal shields 1610 as the glass exits to effect better control of heat transfer uniformity with respect to the glass sheet 1402

It is noted that the glass wafers 700 discussed with respect to TABLE 1 were made in a glass manufacturing system utilizing the heat transfer improvements associated with A, B and C.

Although several embodiments of the glass wafer, thinning system, and methods have been illustrated in the accompanying Drawings and described in the foregoing Detailed Description, it should be understood that the glass wafer, thinning system, and methods are not limited to the disclosed embodiments, but are capable of numerous rearrangements, modifications and substitutions without departing from the spirit of the glass wafer, thinning system, and methods as set forth and defined by the following claims.

The invention claimed is:

1. A non-polished glass wafer comprising:
a body including a non-polished first surface and a non-polished second surface which are substantially parallel to each other, wherein:
the body has a wafer quality index which is less than about 6.0, wherein the wafer quality index is equal to a total thickness variation in micrometers plus one-tenth of a warp in micrometers, wherein the total thickness variation is a difference between a highest thickness elevation and a lowest thickness elevation across the body between the non-polished first surface and the non-polished second surface, and the warp is a sum of absolute values of a maximum distance between a highest point and a least squares focal plane applied to a shape of the body and a maximum distance between a lowest point and the least squares focal plane applied to the shape of the body, where the highest point and the lowest point are both with respect to a same non-polished surface of the body; and
the non-polished first surface has a surface roughness less than about 5 Å RMS.

2. The non-polished glass wafer of claim 1, wherein the body has the wafer quality index less than about 4.5.

3. The non-polished glass wafer of claim 1, wherein the body has the wafer quality index less than about 3.0.

4. The non-polished glass wafer of claim 1, wherein the body has a thickness of about 0.7 mm with the total thickness variation less than about 2.0 µm and the warp less than about 30 µm.

5. The non-polished glass wafer of claim 1, wherein the body has a coefficient of thermal expansion in a range of about 3.0 ppm/° C. to about 3.5 ppm/° C.

6. The non-polished glass wafer of claim 1, wherein the body has a coefficient of thermal expansion in a range of about 3.0 ppm/° C. to about 12.0 ppm/° C.

7. The non-polished glass wafer of claim 1, wherein the body has the total thickness variation less than about 2.0 µm.

8. The non-polished glass wafer of claim 1, wherein the body has a composition containing less than about 0.05% weight percent of $Na_2O$ and $K_2O$.

9. The non-polished glass wafer of claim 1, wherein the body has the warp less than about 60 µm.

10. The non-polished glass wafer of claim 1, wherein the body has an outer diameter in a range of about 150 mm to about 450 mm.

11. The non-polished glass wafer of claim 1, wherein the body has a thickness within a range of about 0.4 mm and 1.1 mm.

12. The non-polished glass wafer of claim 1, wherein the first and second non-polished surfaces have not been polished or smoothened using a mechanical or chemical attrition process.

13. The non-polished glass wafer of claim 1, wherein the glass is an aluminosilicate glass, a borosilicate glass, or a combination thereof.

14. A thinning system for thinning a silicon wafer while the silicon wafer is temporarily bonded to a non-polished glass wafer, the thinning system comprising:
an enclosure;
a support, located within the enclosure, on which is placed the non-polished glass wafer and the silicon wafer which are bonded to one another by a temporary bonding agent;
wherein the silicon wafer has a first surface with a circuit die formed therein and a second surface which are substantially parallel to each other;
wherein the non-polished glass wafer has a body including a non-polished first surface and a non-polished second surface which are substantially parallel to each other, wherein the body has a wafer quality index which is less than about 6.0, where the wafer quality index is equal to a total thickness variation in micrometers plus one-tenth of a warp in micrometers, where the total thickness variation is a difference between a highest thickness elevation and a lowest thickness elevation across the body between the non-polished first surface and the non-polished second surface, and the warp is a sum of absolute values of a maximum distance between a highest point and a least squares focal plane applied to a shape of the body and a maximum distance between a lowest point and the least squares focal plane applied to the shape of the body, where the highest point and the lowest point are both with respect to same surface of the body and wherein the non-polished first surface has a surface roughness less than about 5 Å RMS; and
a thinning mechanism, located within the enclosure, that is suitable for thinning the second surface of the silicon wafer while the silicon wafer is temporarily bonded to the non-polished glass wafer.

15. The thinning system of claim 14, wherein the thinning mechanism includes a mechanical grinding device, a chemical mechanical polishing device, an etching device or any combination thereof.

16. The thinning system of claim 14, wherein the non-polished glass wafer has at least one of the following additional attributes:
a coefficient of thermal expansion in a range of about 3.0 ppm/° C.-12.0 ppm/° C.;
the total thickness variation less than about 2.0 µm;
the warp less than about 60 µm;
an outer diameter in a range of about 150 mm-50 mm; or
a nominal thickness within a range of about 0.4 mm and 1.1 mm.

17. The thinning system of claim 14, wherein the non-polished glass wafer has a composition containing less than about 0.05% weight percent of $Na_2O$ and $K_2O$.

18. A method for using a non-polished glass wafer to thin a silicon wafer comprising the steps of:
providing the silicon wafer having a first surface with a circuit die formed therein and a second surface which are substantially parallel to each other;
providing the non-polished glass wafer comprising a body including a non-polished first surface and a non-polished second surface which are substantially parallel to each other, wherein the body has a wafer quality index less than about 6.0, where the wafer quality index is equal to a total thickness variation in micrometers plus one-tenth of a warp in micrometers, where the total thickness variation is a difference between a highest thickness elevation and a lowest thickness elevation across the body between the non-polished first surface and the non-polished second surface, and the warp is a sum of absolute values of a maximum distance between a highest point and a least squares focal plane applied to a shape of the body and a maximum distance between a lowest point and the least squares focal plane applied to the shape of the body, where the highest point and the lowest point are both with respect to same surface of the body, and wherein either the first surface of the silicon wafer or the non-polished first surface of the glass wafer has a temporary bonding agent applied thereto, and wherein the non-polished first surface has a surface roughness less than about 5 Å RMS;

placing the silicon wafer next to the non-polished glass wafer so the temporary bonding agent bonds the first surface of the silicon wafer to the non-polished first surface of the glass wafer;

thinning the second surface of the silicon wafer while the silicon wafer is bonded to the non-polished glass wafer; and separating the thinned silicon wafer from the non-polished glass wafer.

19. The method of claim 18, wherein the non-polished glass wafer has at least one of the following additional attributes:

a coefficient of thermal expansion in a range of about 3.0 ppm/° C.-12.0 ppm/° C.;

the total thickness variation less than about 2.0 μm;

the warp less than about 60 μm;

an outer diameter in a range of about 150 mm-450 mm; or a nominal thickness within a range of about 0.4 mm and 1.1 mm.

* * * * *